United States Patent
Norström et al.

(10) Patent No.: US 6,657,242 B1
(45) Date of Patent: Dec. 2, 2003

(54) TRENCH-ISOLATED BIPOLAR DEVICES

(75) Inventors: Hans Norström, Solna (SE); Ola Knut Tylstedt, Vällingby (SE); Anders Lindgren, Sollentuna (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/632,936

(22) Filed: Aug. 4, 2000

Related U.S. Application Data

(62) Division of application No. 09/040,384, filed on Mar. 18, 1998, now Pat. No. 6,121,102.

(30) Foreign Application Priority Data

Mar. 18, 1997 (SE) ................................. 9701002
Nov. 25, 1997 (SE) ................................. 9704333

(51) Int. Cl.[7] .................. H01L 31/0328; H01L 31/0336
(52) U.S. Cl. ...................................... 257/197; 257/205
(58) Field of Search ........................ 257/197, 47, 205, 257/233, 378, 423, 477, 526, 552, 555, 556, 557, 575, 510, 565; 438/235, 309, 312, 234, 205, 313, 340

(56) References Cited

U.S. PATENT DOCUMENTS

| | | | |
|---|---|---|---|
| 5,003,365 A | * 3/1991 | Havemann et al. | 357/34 |
| 5,336,909 A | * 8/1994 | Katoh et al. | 257/197 |
| 5,468,989 A | * 11/1995 | Nishizawa et al. | 257/517 |
| 5,644,157 A | * 7/1997 | Iida et al. | 257/521 |
| 5,683,075 A | * 11/1997 | Gaul et al. | 257/510 |
| 5,877,539 A | * 3/1999 | Yamazaki | 257/514 |
| 5,892,264 A | * 4/1999 | Davis et al. | 257/511 |
| 6,049,098 A | * 4/2000 | Sato | 257/198 |
| 6,104,078 A | * 8/2000 | Iida et al. | 257/524 |
| 6,130,458 A | * 10/2000 | Takagi et al. | 257/351 |
| 6,198,150 B1 | * 3/2001 | Gelzinis | 257/510 |
| 6,348,396 B1 | * 2/2002 | Ishitsuka et al. | 438/424 |
| 6,362,040 B1 | * 3/2002 | Tews et al. | 438/246 |

FOREIGN PATENT DOCUMENTS

SE 9702693-4 7/1997

OTHER PUBLICATIONS

P.C. Hunt and M.P. Cooke, "Process HE: A highly advanced trench isolated bipolar technology for analogue and digital applications", Proc of IEEE 1988, Custom & Integr. Circuits Conf., N.Y., May 16–19.

J.A. Appel et al., "Local oxidation of silicon and its application in semiconductor technology", Philips Res. Rept. vol. 25, 1970, pp. 118–132.

* cited by examiner

*Primary Examiner*—Tom Thomas
*Assistant Examiner*—Douglas W. Owens
(74) *Attorney, Agent, or Firm*—Burns, Doane, Swecker & Mathis, L.L.P.

(57) ABSTRACT

In order to produce an electrical connection to an inner layer such as a bottom diffusion (103), which has a good electrical conductivity and is located inside a bipolar semiconductor device isolated by trenches (119) and which for example forms a subcollector of a NPN-transistor, a hole (157) in a trench is used. The hole is filled with electrically conducting material and extends from the surface of the device to the bottom diffusion (103), so that the electrically conducting material in the hole is in contact therewith. The hole (157) is made aligned with a sidewall of the trench (119) by using selective etching. The hole can be made at the same time as contact holes for metallization are made and then also be filled in the metallization step, to contact the bottom diffusion. For a lateral PNP-transistor the hole can be made as a closed groove constituting the outer confinement of the base area, passing all around the transistor. The outer sidewall of such a closed trench can, as seen from above, be bevelled by 45°, so that no inner corners having too small angles are found in the trench, what facilitates the filling with oxide.

19 Claims, 19 Drawing Sheets

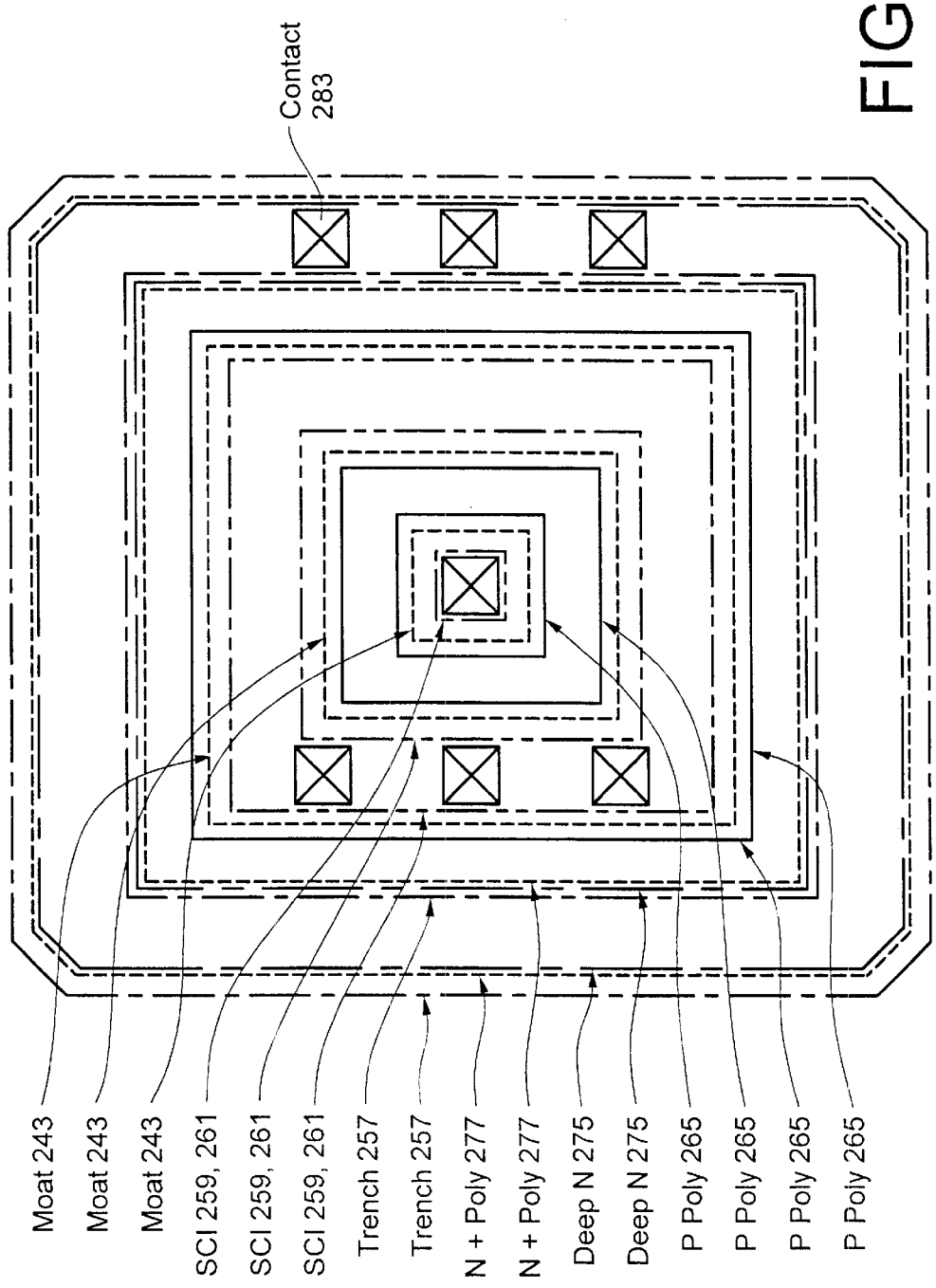

TRENCH-ISOLATED BIPOLAR DEVICES

This is a divisional of application Ser. No. 09/040,384, filed on Mar. 18, 1998, now U.S. Pat. No. 6,121,102.

TECHNICAL FIELD

The present invention relates to bipolar semiconductor devices, in particular bipolar transistors and semiconductor diodes, which are electrically isolated or confined by trenches.

BACKGROUND

When manufacturing bipolar transistors one can use a highly doped inner layer, a bottom diffusion or "buried layer". The purpose of this bottom diffusion layer is to reduce the collector series resistance for NPN-transistors and to serve as a base connection for corresponding lateral PNP-transistors. By introducing a highly doped bottom diffusion, in the cases usually of type N+, the performance of the components can be considerably improved. Such a bottom diffusion, which is produced before an epitaxial layer is grown on the silicon plate, on which the components are built, is then connected from the component surface through a region comprising a deep diffusion of type N+. In this region a doping has first been made at the surface and then the atoms introduced in the doping process have been made to diffuse deeply down into the silicon plate by a suitable heat treatment. The individual components manufactured on the same silicon plate can be isolated from each other by areas comprising deep P-diffiusions, which extend through the epitaxial layer down to the inner or interior material of the silicon plate, i.e., the substrate, which in these cases is silicon of P-type.

For the NPN-transistor shown in FIG. 1, the highly doped inner layer or bottom diffusion layer 1 is produced by diffusion from the surface of the P-substrate 3, before the epitaxial layer 5 of N-type is grown on the silicon plate 3. The bottom diffusion 1 is located under the whole active area 7 of the collector and is intended to reduce the series resistance of the collector connection. This series resistance is for NPN-transistors normally determined by a rather thin region of the weakly doped silicon layer of N-type, which forms the active collector area 7. By shunting in this way the weakly doped, very collector layer 7 by a highly doped bottom diffusion 1 which has a lower resistivity and is type N+ for NPN-transistors, component performance can be considerably improved, i.e., the resistance between the exterior collector contact 9 and the active portion 7 of the collector is reduced. The bottom diffusion 1 of type N+ is then connected from the surface of the component through a deep localized diffusion 11 of type N+ for obtaining a so called collector plug, the upper surface of which is connected to the exterior collector contact 9. The bottom diffusion layer 1 is furthermore located so that it extends under all of the active area of the transistor. It thus extends under all of the very base in the P-layer 13 and under the emitter layer 15, which is doped to N+. The individual transistors are isolated from each other by deep localized diffusion regions 17 of type P+, which extend through the epitaxial layer 5 down to the substrate 3, which, as has already been indicated, in the standard case is P-type silicon.

In some IC-applications also lateral bipolar transistors of PNP-type are also used, see FIGS. 2a and 2b. In this case the bottom diffusion layer 21, which also in this case is of type N+, constitutes a connection to the very base 23, which is an epitaxial N-layer. In order to further reduce the contact resistance to the base 23 here a deep localized diffusion 25 of type N+ is also used, which extends from the surface of the component down to the bottom diffusion 21. The bottom diffusion 21 also in this case extends under all of the active area of the transistor, i.e., under the very collector 27 of type P+ and all of the emitter 29, which is also doped to P+. The bottom diffusion 21 is as above produced by diffusion from the surface of the P-substrate 31. In the plan view of FIG. 2b the generally square layout of the PNP-transistor appears, the various regions or areas forming square structures or square frame-like or annular structures.

The advantages of using a bottom diffusion in this case comprise:

i) that the base resistance is reduced ii) that the concentration of holes in the connection intermediate region or junction between the epitaxial layer 23 which is of N-type and the substrate 31 of P-type is reduced. Thereby, the current gain is reduced for the vertical-parasitic PNP-transistor, which is formed by substrate-base-emitter or substrate-base-collector.

In that way a better current amplification and a better frequency behavior are obtained in the PNP-transistor.

Also in this case the components can be isolated from each other by deep P-diffusions, not shown, which extend through the epitaxial layer 23 down to the substrate 31, which is P-type silicon.

When manufacturing high frequency transistors, for which one wants to obtain very high performance, it is common to replace the isolating, deep localized diffusions 17 of type P+, as mentioned above in conjunction with FIG. 1 and intended for isolating individual components such as transistors, by ditches etched deeply down into the silicon having at least in their upper portions substantially vertical side walls, so called "trenches", see FIG. 7 and e.g. P. C. Hunt and M. P. Cooke, "Process HE: A highly advanced trench isolated bipolar technology for analogue and digital applications", Proc. of IEEE 1988, Custom & Integr. Circuits Conf., N.Y., May 16–19. Thereby, the capacitance between the bottom diffusion and the substrate can be considerably reduced at the same time as the dimensions of the individual transistor can be reduced, in particular its extension in lateral directions, i.e., in directions along the surface of the silicon plate, and a better isolation mutually between components is obtained.

In directions along the surface of the structure in all these designs a lot of area is consumed for producing both the collector plug and the base connection diffusion, respectively, and devices for isolating transistors from each other.

U.S. Pat. No. 5,003,365 discloses a bipolar transistor of NPN-type. The connection to the N-collector area 6 is obtained by the fact that a trench, which is isolated by means of oxide on its sidewalls, is filled with electrically conducting polysilicon of type N+. A hole exists in the oxide layer in a sidewall of a trench, from which a limited region has been diffused from the filling material in the trench. This region obtains an approximatively semi-cylindrical shape, having the flat surface extending along a diameter plane located at the sidewall of the trench. Producing this hole in the sidewall oxide requires a plurality of extra processing steps. The transistor takes, owing to the connection of the collector through a trench, a small area on the substrate surface. By the fact that furthermore all of the width of the trench is used for connecting, the isolating function thereof is reduced and can result in undesired capacitances to the substrate.

In U.S. Pat. No. 5,496,745 a bipolar transistor is disclosed having a bottom diffusion 22 located under the active collector layer 23, where the bottom diffusion is directly connected to a contact plug 35 outside trenches, which define the collector layer. The transistor takes a large area of the substrate surface.

In U.S. Pat. No. 5,187,554 which corresponds to the published European patent application 0 303 435 a bipolar NPN-transistor having a buried collector region is disclosed. In FIGS. 3–5 it is illustrated how the collector region is connected to the exterior electrical contact through a recess made at least partly in an isolating trench, the recess being made at the inner sidewall of the trench. This construction results in a reduced area of the transistor produced and reduced parasitic capacitances.

SUMMARY

It is an object of the present invention to provide a trench isolated transistor having improved performance.

In particular it is an object of the present invention to provide a trench isolated transistor having good performance which takes a little area on a substrate.

It is a further object of the present invention to provide a trench isolated transistor which has a capacitance between substrate and collector which is as small as possible.

It is a further object of the present invention to provide a device and a method for connecting to an inner conducting layer in a trench isolated semi-conductor device, which can be easily produced and can be carried out in a simple way, respectively, using a minimum number of extra steps when manufacturing the semi-conductor device.

It is a further object of the present invention to provide a device and a method for the connecting an inner conducting layer in a trench isolated semi-conductor device, which gives a minimum influence on the electric characteristics of the device, in particular the isolation thereof from other devices manufactured on the same substrate.

It is a further object of the present invention to provide a transistor isolated by a trench, in which the trench and trenches can be produced in an efficient way.

A bipolar device is of the general kind as disclosed in U.S. Pat. No. 5,187,554 cited above. It has an electric connection, having a small resistance, to an inner layer such as a bottom diffusion in a transistor and the connection takes a small area at the surface of the substrate. Thereby, also the transistor will take a small area of the substrate, and thereby the length of the bottom diffusion laterally can also be reduced resulting in a reduced capacitance to the substrate.

A problem to be solved by the invention is how it will be possible to provide a connection having small requirements of space, which at the same time can be produced in a simple way, using as few additional processing steps as possible and also using processing steps which can be easily executed.

In order to obtain an electric connection to an interior region or an interior layer, which has a good electric conductance and is located inside a bipolar semi-conductor device which is isolated by trenches, in particular a bottom diffusion, which forms a subcollector or a base contact, a hole in a trench is used. The interior region or layer is generally located under all of the active region of the bipolar device. The hole is filled with electrically conducting material and extends from the surface of the device as far down, that the electrically conducting material therein comes in contact with the interior region or the layer having a high conductivity. As in the patent U.S. Pat. No. 5,187,554 cited above thereby a semi-conductor device is obtained, which takes a small space laterally on a substrate. By the fact that the lateral length of the bottom diffusion thereby can also be reduced, since the connection is made at a side surface of the bottom diffusion and no area thereof in the direction of the surface is required for connecting, also the capacitance of the bottom diffusion to the substrate is reduced. Producing the hole may require one extra processing step, but the filling of the hole can be made at the same time as some layer is applied, which is required for producing other details of the bipolar device, for example at the same time as material is deposited in an emitter opening or that metal material is deposited for exterior connections. The hole can also, if required, be filled in an extra processing step.

The hole is advantageously located at the sidewall of the trench at the border surface thereof to the surrounding material, and then also forms an opening in the oxide layer, which an isolating trench conventionally has at its sidewalls. This opening in the oxide layer has an edge at the upper free surface of the device. A sidewall of the hole then coincides with an imagined portion of the side surface of the trench, i.e., a former side surface, which existed before the hole was produced. Thereby, the electrically conducting material in the hole comes in electrical contact with that region in the device outside the trench, which is located at the hole. By using a selective etching process only attacking material in trench but not material in the region laterally adjacent to the trench, this results in a simple production process. The hole in the trench thus extends from the opening of the trench at the surface of the device perpendicularly to the surface thereof downwards at a side of the trench, and it is further located at a distance from an opposite side of a trench, so that at the opposite side a region remains comprising the electrically isolating of semi-isolating material. Owing to this region which is considerably thicker than a thermal surface oxide, the capacitance of the material of the contact hole to the substrate material will be low.

The recess for contacting the interior such as a bottom diffusion is, e.g., for a lateral PNP-transistor made as a closed groove and thus has a ring shape. It extends around an active area of the device and confines by a first sidewall the active area of the device and thus has a direct border to the active area.

The electrically conducting material in the recess can include some type of highly doped silicon, such as doped amorphous silicon and/or doped microcrystalline silicon and/or doped polysilicon or even metal, in particular tungsten. The recess can, in one embodiment, be defined and etched at the same time as other contact holes to active areas of the device, and furthermore the recess can be filled at the same time as other contact holes by depositing tungsten using CVD-methods, so that no extra processing step is required for making the recess.

The trenches used in the device can be produced in the usual way by etching. Thereafter, on the walls of the trenches a laminated layer of at the bottom thermally grown silicon oxide and thereon a thin silicon nitride layer are applied by means of deposition. Finally the remaining main portions of the trenches are filled by applying a silicon oxide layer over the surface of the plate, for example by depositing of a suitable kind. The silicon nitride layer then acts as an etch stopping layer in a following planarizing etching step for planarizing that silicon oxide layer, with which the main portion of the trenches is filled. Furthermore, if the silicon oxide material used in the filling process would have impurities, the silicon nitride layer prevents that they diffuse into the substrate material. Such a diffusion could reduce the electrically isolating effect of the trenches.

The sidewalls of the annular groove can, as seen from above, be substantially parallel to each other and be located at a uniform distance from each other around all of the active area. The sidewalls extend advantageously along the outlines of two concentric rectangles or squares placed inside each other. Rectangular corners in the outline of the outer sidewall can be bevelled by 45°, so that this sidewall will always extend along a polygon, the inner angles of which all are equal to 135°, in order to facilitate, when producing the device, the refilling of the groove with the electrically conducting material. The same can advantageously also be true for the sidewalls of the trench. Generally, the corners of the exterior sidewall of the groove and also of the trench should have angles substantially exceeding 90', in particular angles of substantially 135° or at least 135° in order to facilitate, when producing the device, the refilling of the groove or of the trench respectively with material.

When the device is a lateral PNP-transistor the emitter area and/or collector area of the transistor can, as to its extension laterally along the surface of the device, be determined by a lithographically defined opening in an electrically isolating surface layer. In the common way the emitter and collector areas can be surrounded, seen along the surface of the device, by thick field oxide regions, and then the electrically isolating surface layer extends up over and beyond the surrounding field oxide regions in a direction towards the active area, so that a strip of the electrically isolated surface layer is placed between the emitter or collector area, respectively, and the field oxide areas located most adjacent to this area. The electrically isolating surface layer comprises advantageously a laminate of silicon nitride and silicon oxide.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularity in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIG. 25 is a view from above, which schematically shows the outlines of some layers of the finished PNP-transistor.

DETAILED DESCRIPTION

Figure 1:
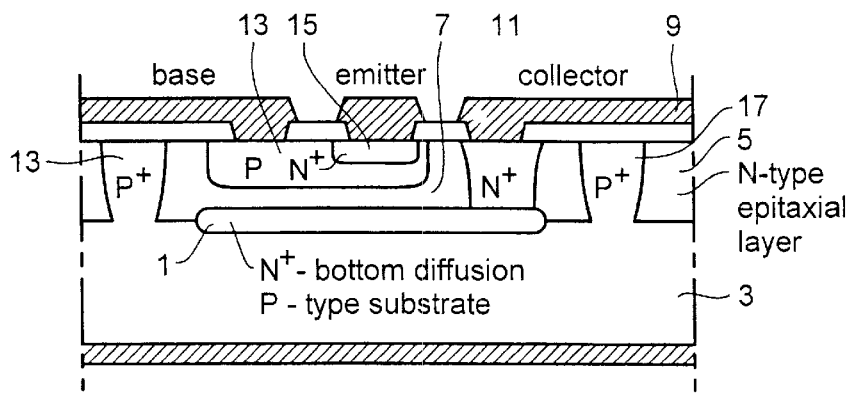
FIG. 1 is a schematic cross-sectional view of a prior art bipolar NPN-transistor having a bottom diffusion.
Figure 3:
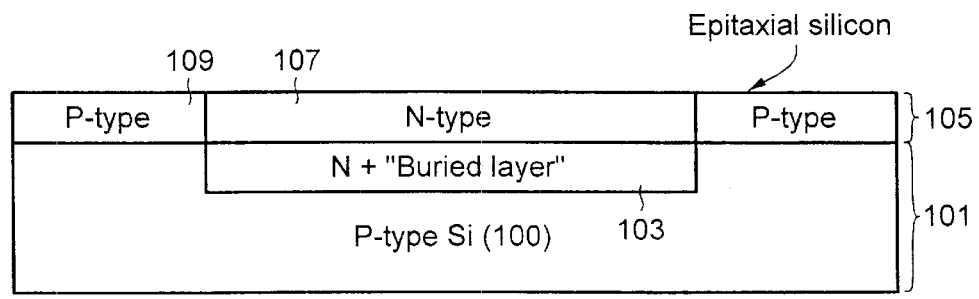
Figure 4:
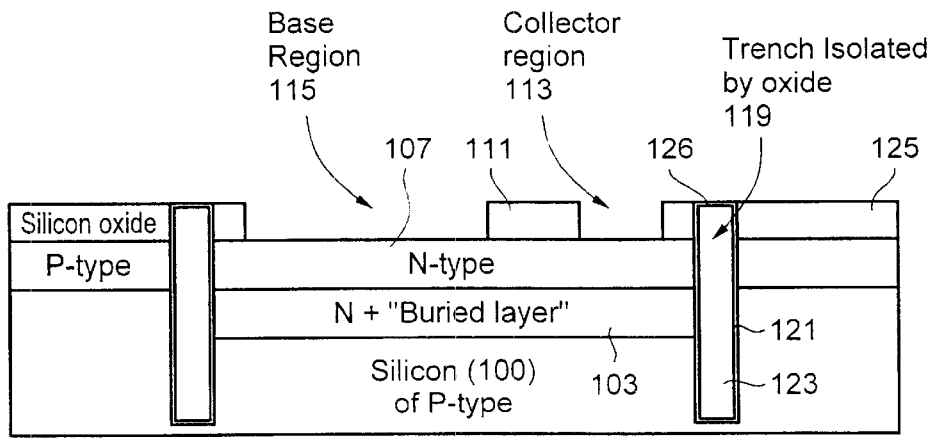
FIG. 4 is a schematic cross sectional view similar to FIG. 3 after defining active areas and forming isolating trenches.

With reference to FIGS. 3–7, a method will first be described for producing a bipolar transistor of NPN-type which is isolated by trenches or ditches and having moderate performance. As a start material a plate 101 of monocrystalline silicon of P-type is used which has its surface located in a (100)-crystal plane, see FIG. 3. The bottom diffusion 103 or "buried layer" of type N+, which can be constituted by, for example, a layer which is ion implanted with arsenic or antimony, is lithographically defined, whereupon an epitaxial silicon layer 105 having a thickness of about a couple of μm is grown on the plate. Thereupon—and P-regions 107, 109, respectively, are defined at the surface of the plate by lithography combined with ion implantation. The N-regions 107, which have been produced by ion implanting using, e.g., phosphorus, are placed directly on top of the bottom diffusion 103 of type N+. The other regions 109, which have been produced by, for example, ion implantation of boron, are P-doped and are not used in the transistor to be manufactured.

The active regions are defined using conventional LOCOS-methods ("LOCal Oxidation Of Silicon"), see, e.g., "Local oxidation of silicon and its application in semiconductor technology", J. A. Appel et al., Philips Res. Rept. Vol. 25, 1970, pp. 118–32, wherein an oxide strip 111 is applied across the N-region 107, for isolating a collector region 113 at the surface from a wider base-emitter-region 115. In the local oxidation outer confining regions 125 are also produced, which extend from the edges of the layer 107 of N-type over the surrounding P-regions 109. Thereupon openings to isolating trenches 119 are lithographically defined to be made from the confining oxide regions 125, see FIG. 4. Then oxide material in the outer confining regions 125 and the substrate material are etched away in the openings using anisotropic dry etching deeply down into the substrate 101, until the trenches have obtained a desired depth, about 5–10 μm. The surfaces in the trenches, i.e., their sidewalls and bottom surfaces, are thermally oxidized in order to form oxide layers 121, whereupon the trenches are filled with an isolating or semi-isolating material 123, for example, silicon oxide or polycrystalline silicon, also called polysilicon. The material applied in the filling process is etched away over the surface of the plate by dry etching, until a flat surface is obtained at the openings of the trenches 119, which surfaces are then located at the same level as the other parts of the surface of the substrate. Thereupon, the openings of the trenches 119 at the component surface are oxidized in the case where the trenches have been filled with polysilicon, in order to obtain an isolating layer 126 at the surface. If the trenches from the start are already filled with oxide, no extra oxidation is required.

Figure 5:
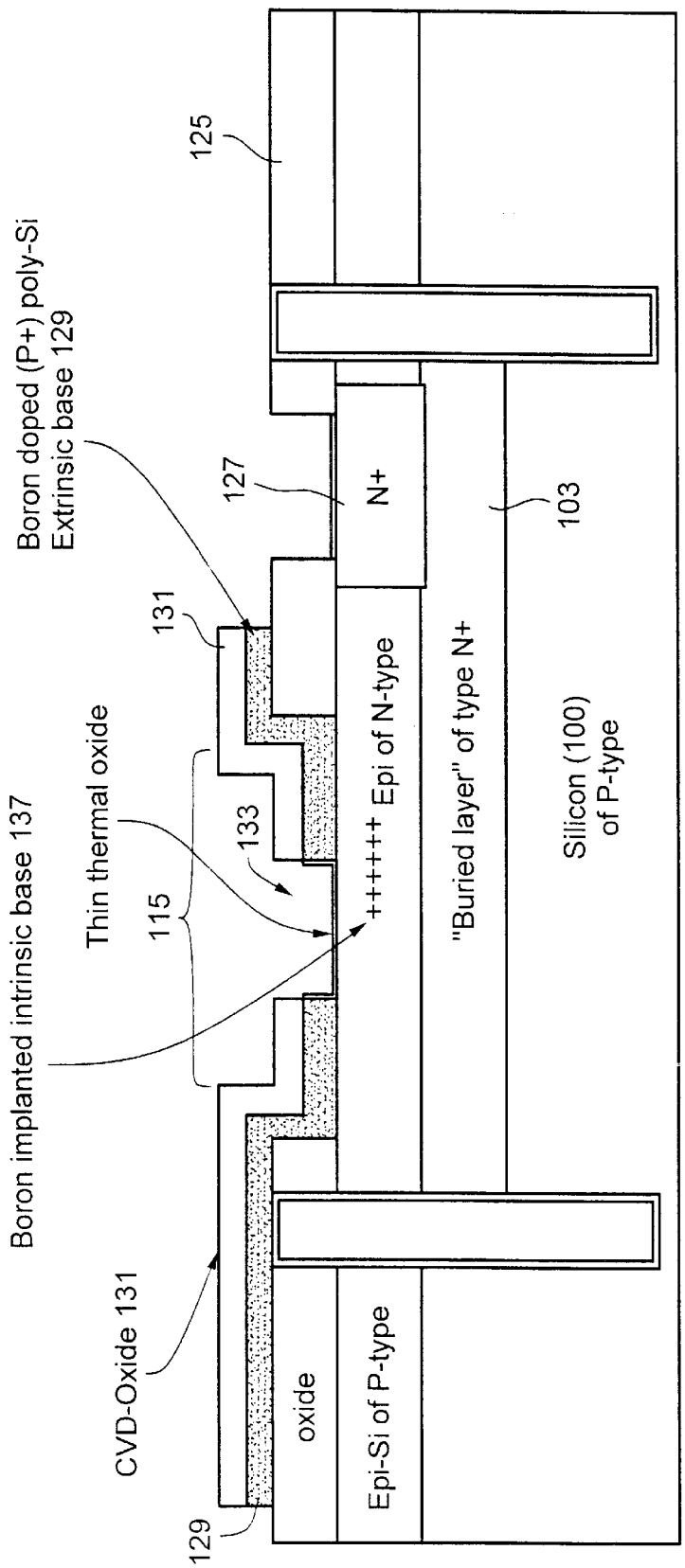
Fig. 5 is a schematic cross sectional view similar to FIG. 4 after forming an extrinsic base connection and implanting for forming an intrinsic base.

After forming the trenches 119 a collector plug 127, i.e., a low resistance connection between the component surface and the bottom diffusion 103, is lithographically defined, whereupon a dopant, usually phosphorous, is applied using ion implantation, see FIG. 5.

The description of the continued method of manufacture will be connected to implementing an NPN-transistor of so called double-poly-Si-type having a self-aligned base-emitter junction, since this type of structure is usually combined with isolation provided by trenches. After defining active regions 113, 115 and forming the collector plug 127 as described above, a thin layer 129 of polysilicon, having a thickness of some hundreds of nm, is deposited on top of the base-emitter region 115, see FIG. 5. The polysilicon layer 129 is thereupon doped to P+ by ion implanting boron, whereupon a thin CVD-oxide ("Chemical Vapour Deposition") layer 131 is deposited on top of the polysilicon layer 129. The polysilicon layer of type P+ and doped with boron will, after finishing processing steps, form an extrinsic base or base connection.

The CVD-oxide layer 131 and the polysilicon layer 129 are lithographically patterned in order to define the emitter opening 133 centrally within the base-emitter region 1 15, whereupon these layers are removed by dry etching, e.g., plasma etching. After producing the emitter opening 133 a thin thermal oxide 135 is grown thereon, whereupon the intrinsic base 137 is produced by ion implanting boron through the thin thermal oxide layer 135. The intrinsic base or the very base 137 will thereby be located directly under the surface at the emitter opening 133.

Figure 6:
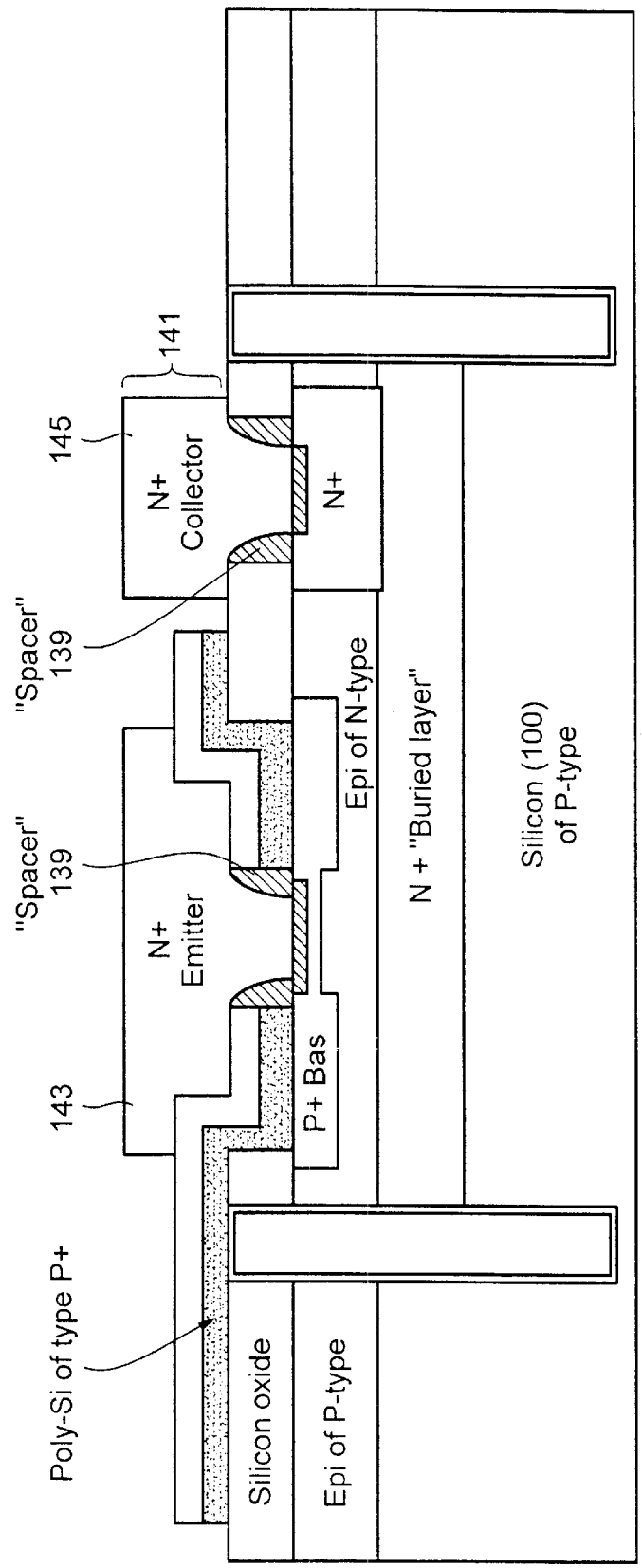
FIG. 6 is a schematic cross sectional view similar to FIG. 5 after forming spacers, an intrinsic emitter and collector and emitter and collector connections.

In order to separate the emitter, which will be produced in a later step, from the extrinsic base in the polysilicon layer 129 having a doping of P+, "spacers" 139 are formed, see FIG. 6, along the edge of the emitter opening 133. This is made by depositing a CVD-oxide layer conformally over the plate, whereupon anisotropic dry etching is used in order to etch the oxide layer away on the flat or horizontal portions of the plate, i.e., those portions which are parallel to the surface of the original plate. Thereby a side string 139 or "spacer" of CVD-oxide is produced along the steps, which have been produced when making the emitter opening 133. After forming the spacers 139 another thin polysilicon layer 141 having a thickness of some hundreds nm is deposited on the plate. This layer is implanted with arsenic in order to become type N+ and forms, after a heat treatment, the emitter 143. After patterning and etching the emitter electrode 143, the structure obtains the configuration which is shown in FIG. 6. Usually one also lets the polysilicon 141, which forms the emitter, remain on the collector, where it serves as a collector terminal 145.

Figure 7:
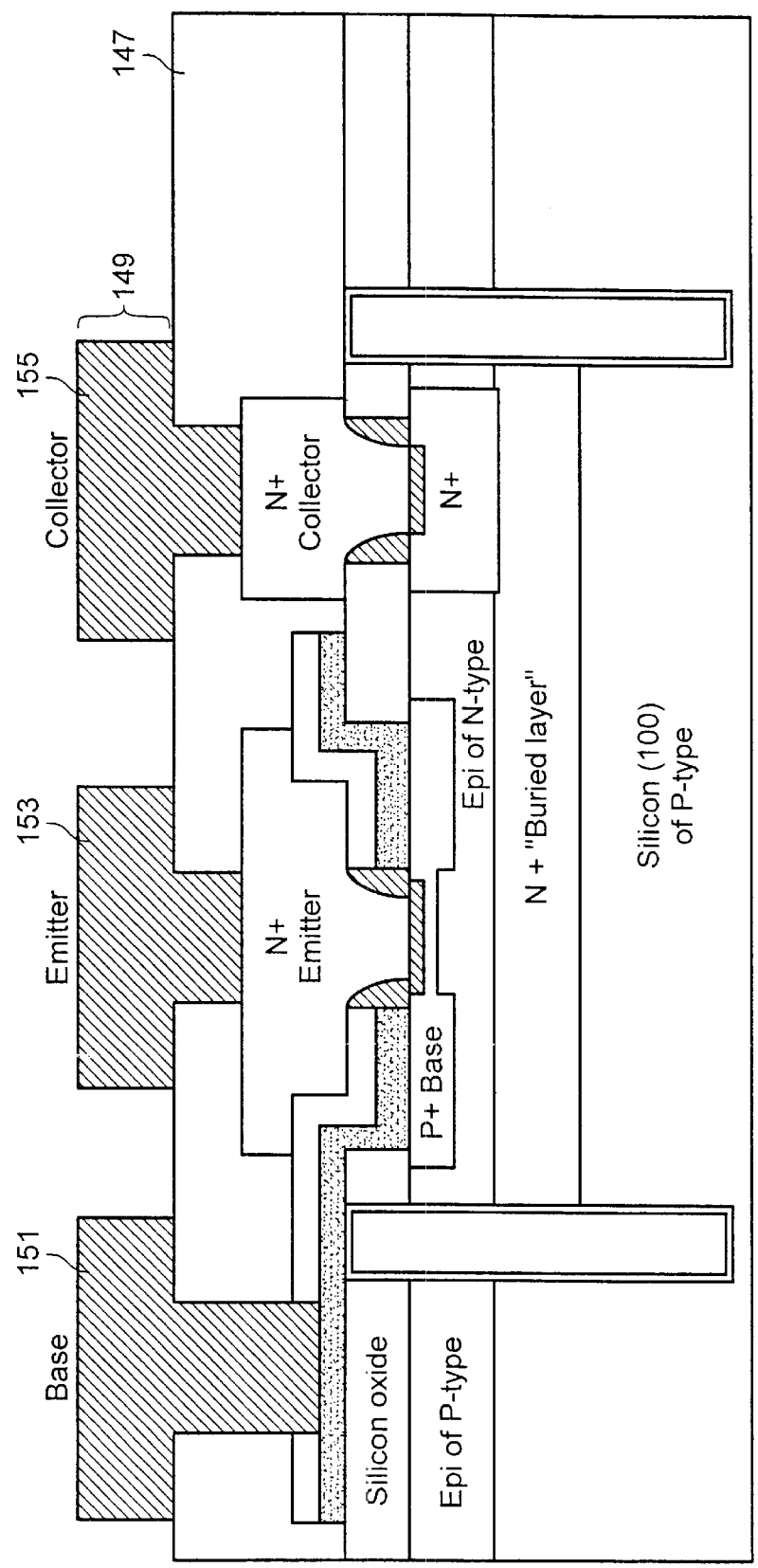
FIG. 7 is a schematic cross sectional view similar to FIG. 6 of the finished NPN-transistor having moderate performance, after passivating and metallization.

The circuit is thereupon passivated by a layer 147 of, for example, silicon oxide, in which contact holes to the base, the emitter and the collector are lithographically defined, see FIG. 7. After etching the contact holes the circuit is metallized by sputtering, for example, aluminium. The conductor layer is then lithographically defined, so that metal contacts 151, 153, 155 to the base, the emitter and the collector, respectively, are obtained. The result appears from FIG. 7.

Now an alternative method will be described with reference to FIGS. 8–13, which has the purpose of producing trench isolated bipolar components of the type as described above but having higher performance. The embodiment of a bipolar transistor achieved thereby is particularly suitable for the case in which one wants to. obtain a small transistor cell and in which the collector-substrate capacitance $C_{sc}$ has to be as small as possible in order to avoid parasitic coupling, such as, e.g., when producing PA-steps ("Power Amplifier" -steps) using bipolar transistors based on silicon. The method is in many details similar to that described above except that dimensions, in particular horizontally, are changed and that some steps are modified particularly as to the location of different component portions and thereby the position of openings in masks, etc. The same reference signs will be used for corresponding items in the drawings. Some common details in the manufacturing process will not be described.

Figure 8:
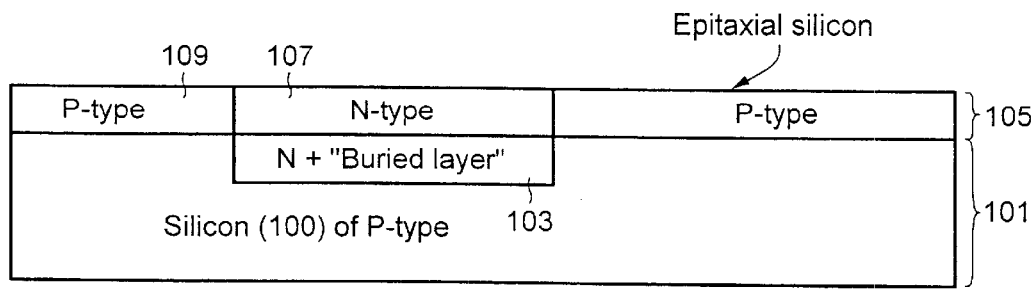
FIG. 8 is a schematic cross sectional view, which shows the structure, which is obtained after forming a bottom diffusion and an epitaxial surface layer when manufacturing a compact bipolar NPN-transistor isolated by trenches and having high performance.

The start material is as above a plate 101 of monocrystalline silicon of P-type having its surface located in a (100)-crystal plane. The bottom diffusion or buried layer 103 having a doping of type N+, see FIG. 8, is formed by a layer, which has been ion implanted with arsenic. The bottom diffusion 103 is lithographically defined, whereafter an epitaxial silicon layer 105 having a thickness of about 1 gm is grown on the plate 101. Thereupon N- and P-regions 107, 109, respectively, are defined on the plate using lithography combined with ion implantation. The N-regions 107, which are produced by ion implanting, e.g., phosphorus, are placed directly on top of the bottom diffusion layer 103 of type N+. The P-doped regions 109 at the surface are, e.g., produced by ion implanting boron.

Figure 9:
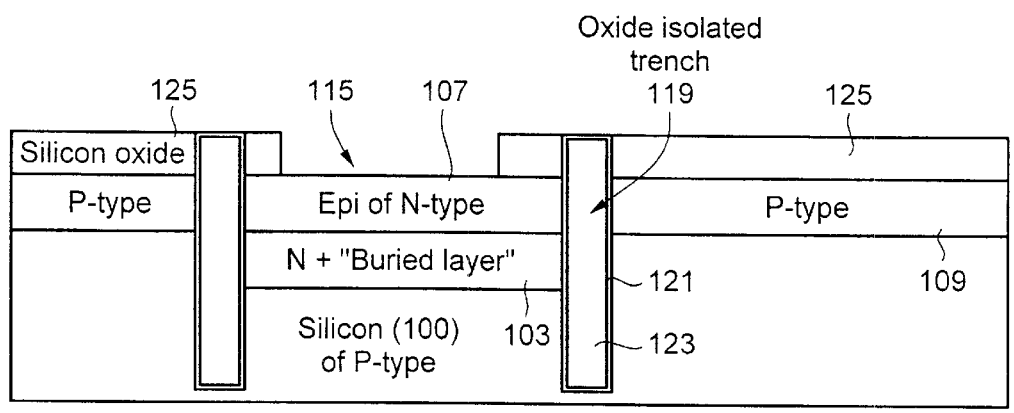
FIG. 9 is a schematic cross sectional to FIG. 8 after defining an active area and after isolating by means of trenches.

An active region is defined using conventional LOCOS-methods, see FIG. 9, in which outer confining oxide regions 125 are formed. The confining regions 125 extend from regions in the vicinity of the edges of the layer 107 of N-type and over the surrounding P-regions 109, for forming a base-emitter region or a base-emitter opening 115, in which thus no oxide layer exists. The base-emitter opening 115 can be located asymmetrically over the layer 107 of N-type, in which an intrinsic base is to be formed and which also forms an active collector region. At one of its sides the opening 115 can thus be located closer to the edge of the layer 107, where the oxide layer 125 thus is only placed over a small marginal region of the layer, whereas at its opposite sides the opening 115 is placed at a larger distance from the opposite edge of the underlying layer, so that here the oxide layer 125 extends over a larger area of the layer 107.

Then openings, in which isolating trenches 119 will be formed, are lithographically defined, see FIG. 9, these openings being arranged at the edges of the epitaxial layer of N-type, i.e., at the border between this layer and the epitaxial layers 109 of P-type. This means that the openings are located on the confining oxide layers 125. In the openings the material in the oxide layer and the substrate material are etched away using anisotropic dry etching in order to form the trenches 119, until they have obtained a desired depth, about 5–10 $\mu$m, so that they extend down into the substrate 101 of P-type, down to a level below the lower surface of the bottom diffusion 103. The trenches 119 are then thermally oxidized so that their sidewalls and bottom surfaces obtain a thin surface layer 121 of silicon oxide, whereupon they are filled with an isolating material 123, for example, silicon oxide deposited over the surface of the plate using CVD-methods, e.g., by chemical decomposition of TEOS (tetmethyl-orthosilicate). The filling material is etched away by dry etching until a flat surface at the surface of the component is obtained. It should be observed that no area for the collector plug is reserved, compare FIG. 4. Hereby, the transistor cell will be considerably smaller and thereby also the surface is reduced, which is occupied by the bottom diffusion 103. This results in that the collector-substrate capacitance $C_{cs}$ is reduced.

Figure 10:
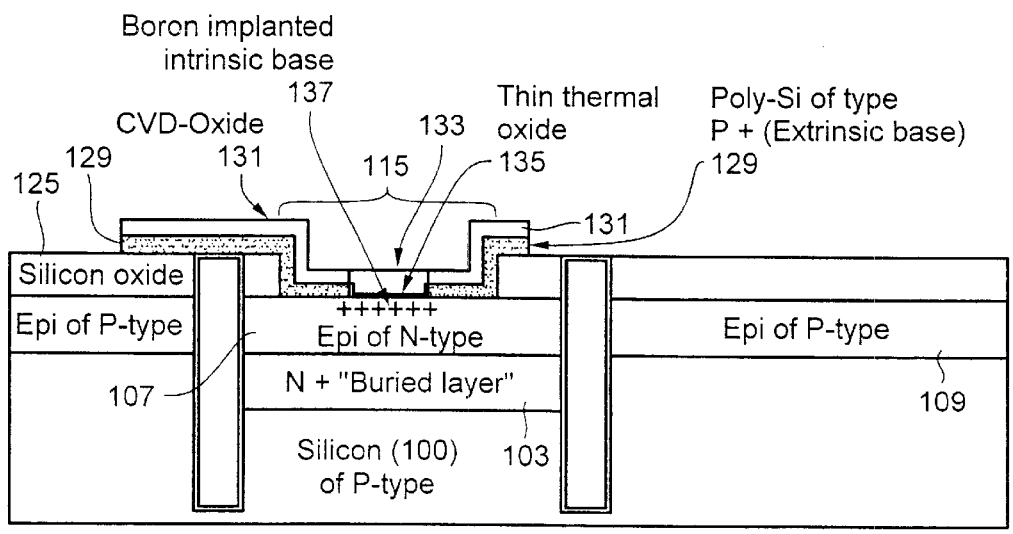
FIG. 10 is a schematic cross sectional view similar to FIG. 9 after forming an extrinsic base connection and implanting for forming an intrinsic base.

After defining the active region by the silicon oxide layers 125 and forming trenches as described above, a thin layer 129 of polysilicon having a thickness of some hundreds of nm is deposited on top of the base-emitter region 115, see FIG. 10. The polysilicon layer 129 is thereupon doped to type P+ by ion implanting boron, whereupon a thin CVD-oxide layer 131 is deposited on top of the polysilicon layer 129. The CVD-oxide layer 131 and the polysilicon layer 129 are lithographically patterned in order to define the emitter opening 133, whereupon these layers are removed in the openings in the lithographic mask by dry etching such as plasma etching. The emitter opening 133 is arranged substantially centrally in the previously produced base-emitter opening 115. The layers 129, 131 are also etched away at places, so that only regions thereof remain at the emitter opening 133. At that side of the emitter opening 133, which corresponds to the side of the base-emitter opening 115, where the oxide layer extends only over a narrow region of the epitaxial layer 107 of N-type, a broader region of these layers 129, 131, which now have been applied, is left, so that they extend over the trench 119 at this side for forming a connecting region for the base. At the opposite side of the emitter opening 133 only a narrow region of the layers 129 and 139 is left, which is located on top of that portion of the oxide layer 125, which is placed over the epitaxial N-region 107. The opening of the trench 119 at this side is thus free from these layers 129, 131.

After patterning the emitter opening 133, a thin thermal oxide 135 is grown, which in particular covers the emitter opening 133, whereupon the intrinsic base 137 is produced by ion implanting boron through the thin thermal oxide 135, see FIG. 10.

In order to separate the emitter to be produced in later steps from the extrinsic base in the polysilicon layer 129 having a doping P+, "spacers" 139 are formed along the edge of the emitter opening, see FIG. 11. These are made by depositing a CVD-nitride layer conformally over the plate, whereupon anisotropic etching is used for etching said nitride layer away on the flat surfaces of the plate, i.e., the portions which are located in parallel to the large flat surface of the plate. Thereby, a side string 139 of CVD-nitride, a "spacer", is produced along the steps which have been produced when making the emitter opening 133.

Figure 11:
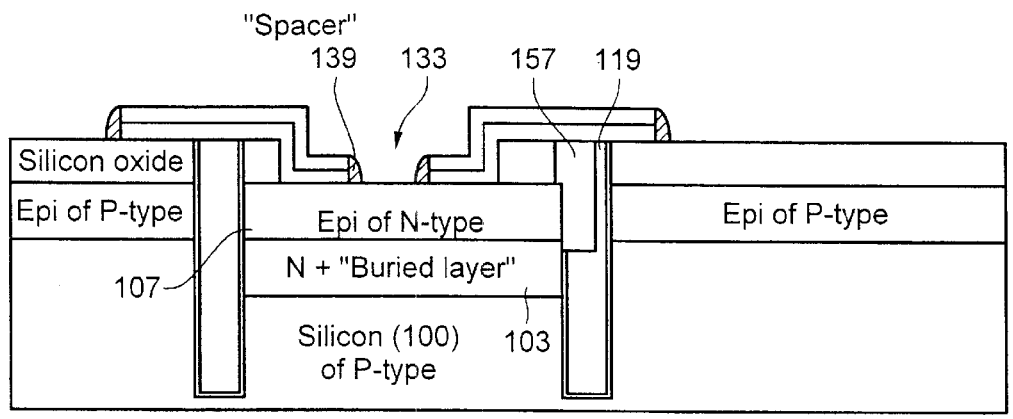
FIG. 11 is a schematic cross sectional view similar to FIG. 10 after forming spacers and making a collector connection hole.
Figure 12:
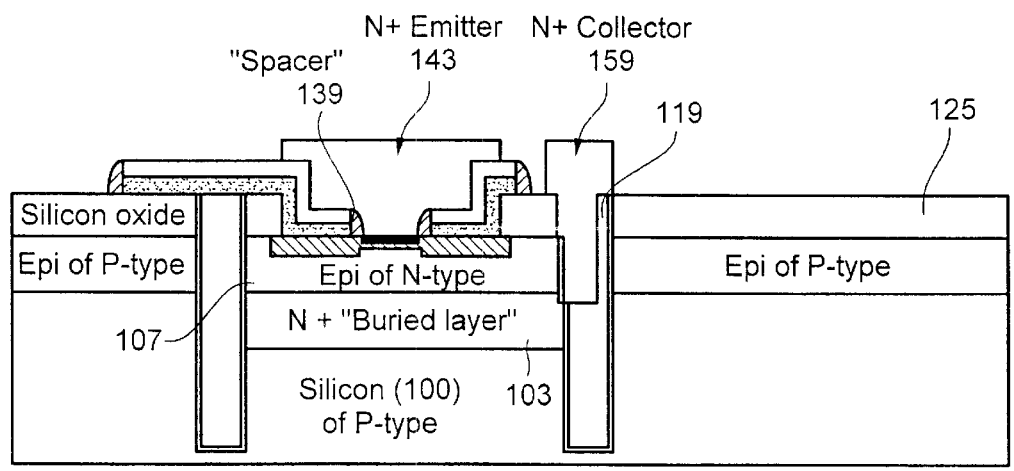
FIG. 12 is a schematic cross sectional view similar to FIG. 11 after forming the intrinsic base and making collector and emitter connections.

After forming spacers, the collector connection is lithographically defined, see FIG. 11 and also compare the collector plug 127 in FIG. 5. The opening in the mask for the collector contact is located over the border surf ace between the corresponding trench 119 and the epitaxial N-layer 107, in which the intrinsic base is to be formed and which in addition contains the very collector. Thereupon the oxide filling the trench is removed by dry etching which is located in the portion of the trench, which corresponds to the mask opening and which will later form the collector contact. This dry etching is, e.g., selective to attack substantially only silicon oxide while attacking pure silicon at a very low etching rate. Then the patterning of a photo lithographic mask layer, not shown, can be made, so that the windows t hereof a re located over the inner border line of the trenches. Then no high accuracy of positioning the windows is required. The resulting hole 157 will then, is apparent from FIG. 11, have one of its sidewalls in direct contact with the N-doped epitaxial layer 107 and the bottom diffusion 103 and have its opposite sidewall located against the inner material in the trench. The hole 157 will hereby be "self-aligned" with the sidewall of the trench. Also, the other two sidewalls will in the normal case be located against the inner material of the trench 119, see also the plan view of FIG. 13c.

After producing the collector contact hole 157, another thin polysilicon layer having a thickness of some hundreds of nm is deposited on the plate, which layer penetrates into the hole 157 and completely fills it. This layer is implanted with arsenic to type N+ and forms, after a heating operation, both the emitter contact and the collector contact 143 and 159, respectively. After patterning and etching the emitter and collector electrodes, the structure obtains the configuration shown in FIG. 12.

Figure 13A:
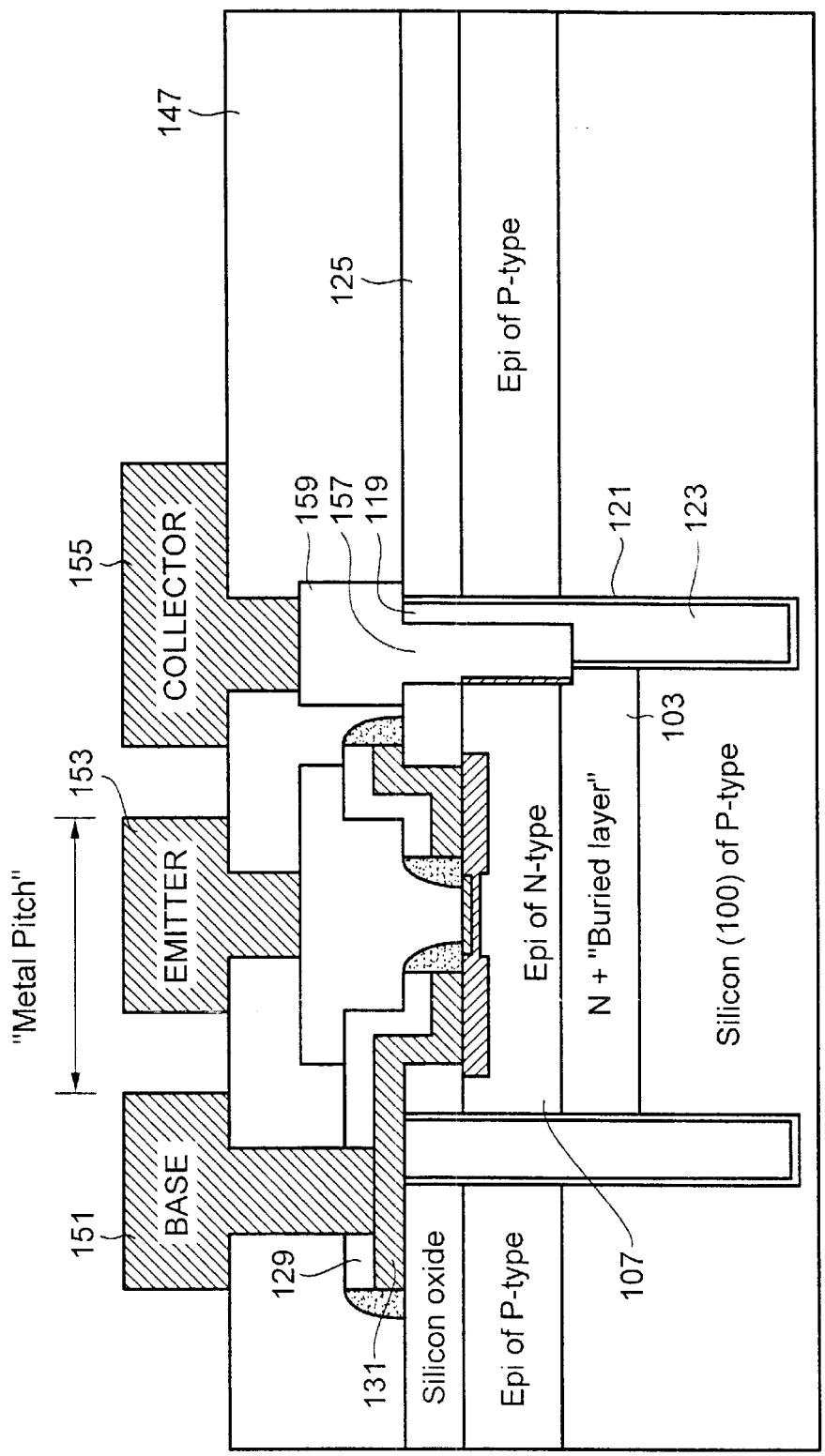
FIG. 13a is a schematic cross sectional view similar to FIG. 12 after passivating and metallization, the construction of the finished NPN-transistor appearing from this cross sectional view.
Figure 13B:
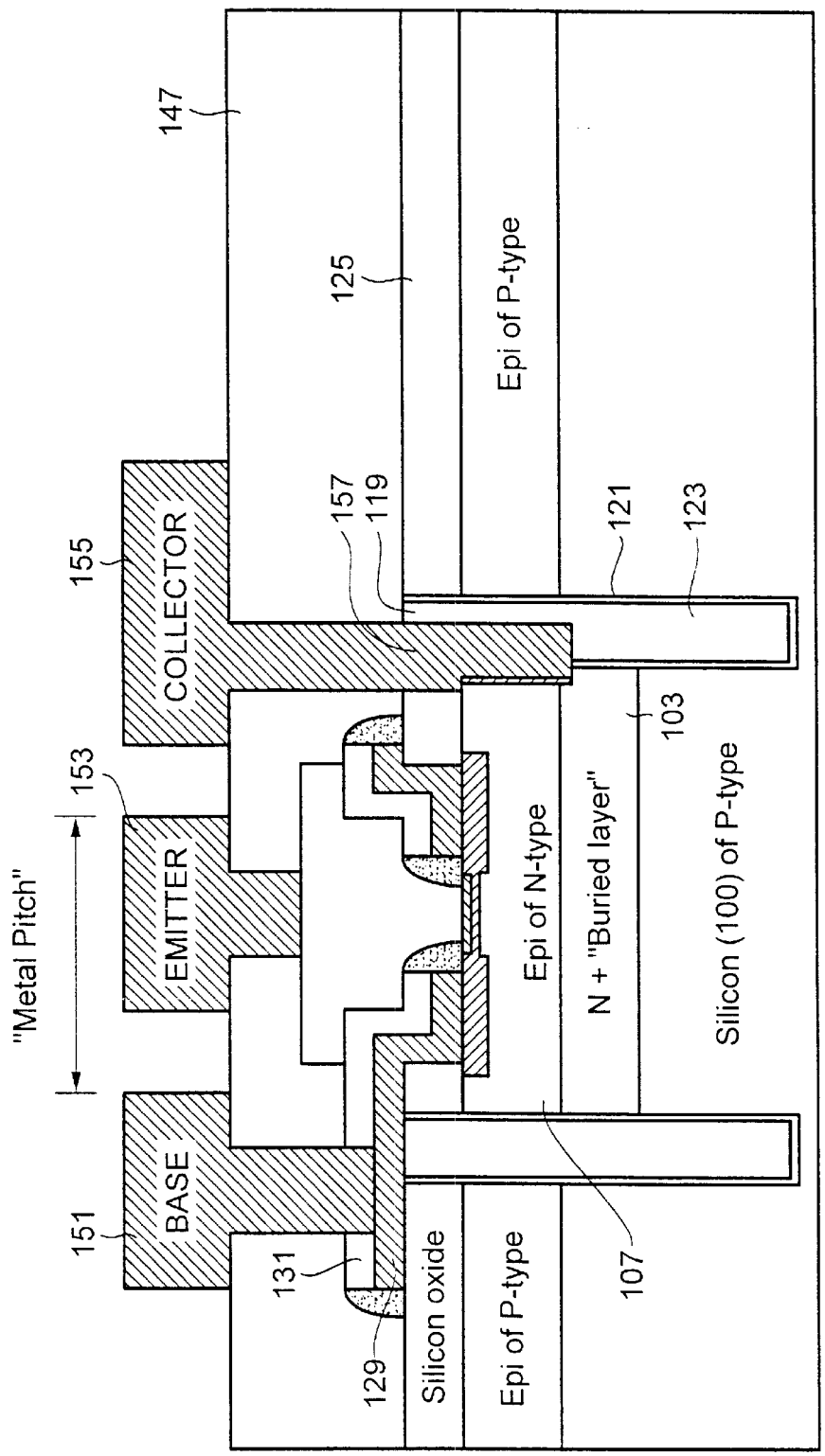
FIG. 13b is a schematic cross sectional view similar to FIG. 13a showing an alternative embodiment of the finished NPN-transistor, in a collector connection is made in a metallization step.
Figure 13C:
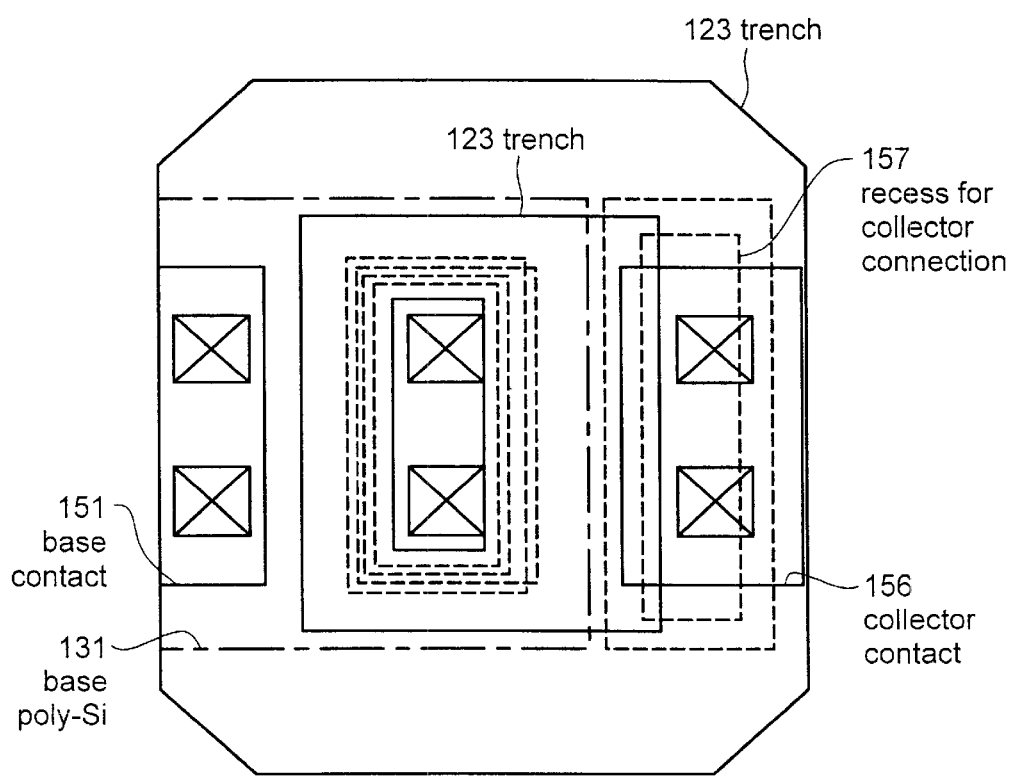
FIG. 13c is a view from above, which schematically shows the outlines of some layers of the finished NPN-transistor according to FIG. 13a, FIG. 14 is a schematic cross sectional view of a structure which is obtained after the first steps including forming a bottom diffusion and an epitaxial surface layer when manufacturing a bipolar PNP-transistor isolated by trenches and having moderate performance.

The circuit is thereupon passivated by applying a layer 147 of for example silicon oxide over all of its surface, in which contact holes to the base, the emitter and the collector are lithographically defined, see FIG. 13a. After etching contact holes, the circuit is metallized by sputtering of for example aluminium. The conductor layer is then lithographically defined in order to form metal contact plugs 151, 153, 155. The result appears from FIG. 13a, see also the plan view of FIG. 13c. It can be observed that in this embodiment the dimensions of the transistor cell, are completely defined by the spacing, which can be used when placing the respective metal conductors, which are intended for external electrical connecting, i.e., the size of the transistor is "metal-pitch" limited.

The method of forming a connection to a bottom diffusion or generally to an inner layer or region having a good electrical conductance inside a trench isolated by oxide is naturally not limited to NPN-transistors, but works equally well for lateral PNP-transistors, in which the bottom diffusion forms a base, as will be described hereinafter.

The hole for forming a connection to the inner region, the bottom diffusion, can generally be filled with an electrically conducting material, such as a layer of amorphous silicon, microcrystalline silicon or polycrystalline silicon, which is either undoped or is doped in a later step or which is N-type and doped in a deposition operation. The production method described above can be modified, so that this layer of amorphous silicon, microcrystalline silicon or polycrystalline silicon at the same time forms both the emitter and collector contact, i.e., so that the hole is filled at the same time as the material for the emitter and collector contacts is applied. Furthermore, the hole can be filled with metal such as tungsten, which is deposited using CVD-methods. In this case, the hole can be defined and etched at the same time as other contact holes in the manufacturing process and then the hole can also be filled at the same time as other contact holes with tungsten deposited using CVD. This latter case is illustrated by the alternative embodiment of FIG. 13b. The contact hole for the collector is here etched deep down into the trench 119. This can be made by using an etching agent which attacks silicon oxide but does not attack silicon. In this case the trenches 119 may then be filled with silicon oxide.

In conjunction with FIGS. 14–17, a method of manufacturing a lateral bipolar transistor of PNP-type having moderate performance and isolated by trenches will be described. The method is adapted so that it can be integrated in the flow of processing steps when manufacturing a corresponding vertical bipolar transistor of NPN-type, as described above, on the same circuit plate, see Swedish patent application 9702693-4, filed Jul. 11, 1997. A method adapted in that way is advantageous, since the lateral PNP-transistor, which is described herein seldom exists alone in an integrated circuit.

Figure 14:
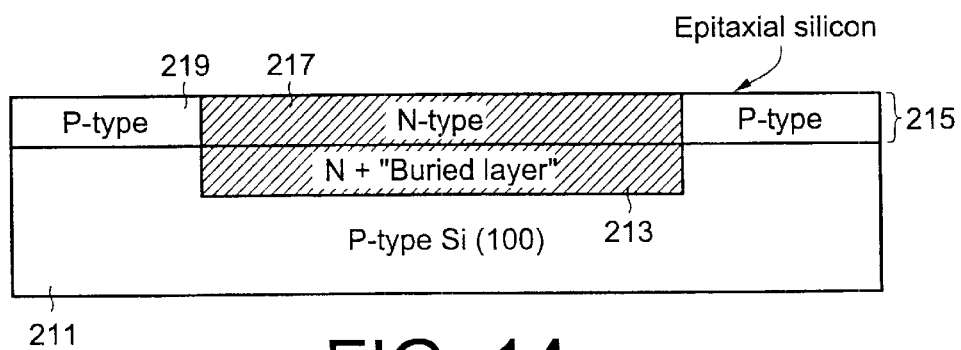

As above, a start material monocrystalline silicon of P-type is used in the shape of a plate or a chip 211 having its surface located in a (100)-crystal plane, see FIG. 14. A bottom diffusion or buried layer 213, which can be formed by, for example, a layer ion implanted with arsenic or antimony, is lithographically defined, after which an epitaxial silicon layer 215 having a thickness of a couple of Elm is applied on the plate. Thereafter, N- and P-areas 217, 219 respectively are defined on the plate by lithography combined with ion implantation. The N-areas 217, which are ion-implanted with, e.g., phosphorous, are placed directly above the bottom diffusion 213 of type N+. Other areas 219, which, e.g., have been ion-implanted with boron, are thus P-doped.

Figure 2A:
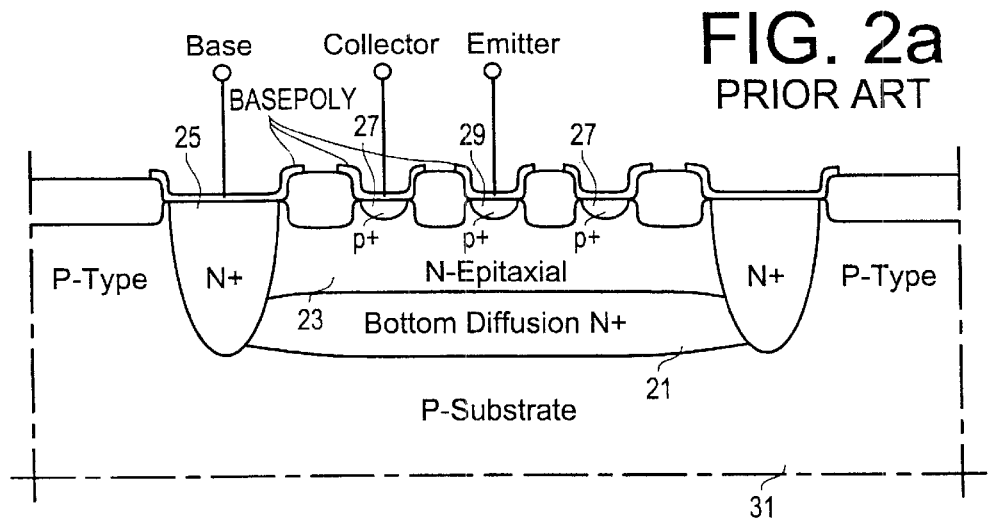
FIG. 2a is a schematic cross-sectional view of a prior art lateral bipolar PNP-transistor having a bottom diffusion for connecting the base.
Figure 2B:
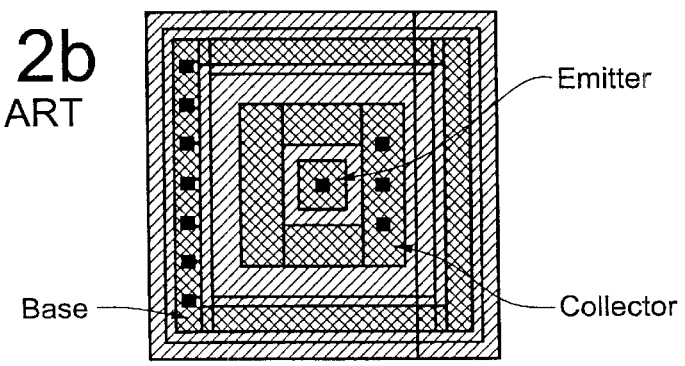
FIG. 2b is a schematic view from above of the PNP-transistor according to FIG. 2a, FIG. 3 is a schematic cross-sectional view of a structure, which is obtained after the first steps when manufacturing a trench isolated NPN-transistor having moderate performance, the first steps including forming a bottom diffusion and an epitaxial surface layer.
Figure 15:
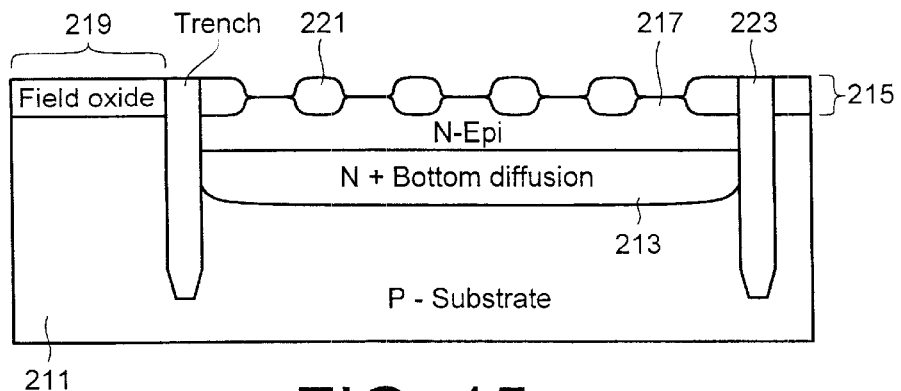
FIG. 15 is a schematic cross sectional view similar to FIG. 14 after defining active areas and isolating by trenches.

After that, see FIG. 15, the active areas are defined by means of conventional LOCOS-methods. Regions comprising thick field oxide 221 are then placed between the areas which are located concentrically with each other and which from an inner point and outwards will form an emitter, a collector and a base connection area of the PNP-transistor, compare also the view from above in FIG. 2b. Then isolating trenches 223 are lithographically defined, after which the substrate material is etched away using anisotropic dry etching, until the trenches 223 have obtained the desired depth, about 5–10 μm. The trenches 223 are thermally oxidized, after which they are filled with an electrically isolating or semi-isolating material, for example silicon oxide or polycrystalline silicon. The filling material is etched away by dry etching, until a flat surface is obtained. Thereafter, the openings at the surface of the trenches 223 are oxidized in the case where the trenches have been filled with polysilicon, in order to obtain an electrically isolating layer on the surfaces or mouths thereof. In the case where the trenches 223 are from the beginning already filled with silicon oxide, no such extra oxidation is required.

Figure 16:
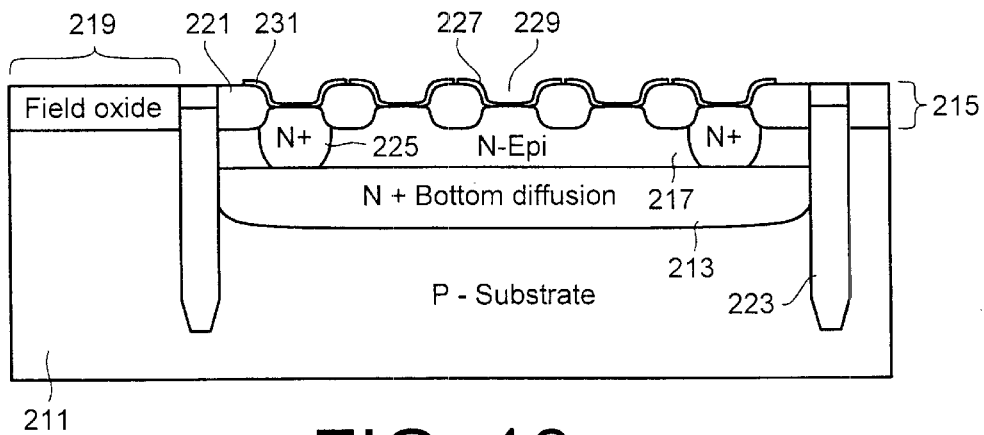
FIG. 16 is a schematic cross sectional view similar to FIG. 15 after defining emitter and collector and base connection areas.

After forming the trenches 223, in the outermost of the three concentric regions located between the field oxide strings 221 plugs 225 of type N+ lithographically defined, see FIG. 16, which for electrical connection of the base of the transistor are to form a low resistance connection between the surface of the component and the bottom diffusion 213. Thereupon a dopant is applied, usually phosphorous, by ion implanting over the surface of the plate. A heat treatment for driving the dopant into the material in order to form the deep diffusions which are to form the plugs 225 is thereupon executed. After thus defining active regions and forming the plugs of type N+, a thin layer 227 of polysilicon having a thickness of some hundreds of nm is deposited over the plate. On top of this polysilicon layer 227 a thin silicon oxide layer 229 is deposited. The polysilicon layer 227 is thereupon doped to type P+ by ion implanting boron through the thin oxide layer 229, whereupon the thin oxide layer 229 and the polysilicon layer 227 are lithographically patterned, so that these layers after etching will only remain on the emitter and collector regions, i.e., the two innermost ones of the concentric regions defined by the field oxide strings 221, i.e., on the regions which do not contain the deep diffusions which form the plugs of type N+. The remaining regions of the polysilicon layer 227 doped to P+ with boron will, after finishing processing, form an inner connection for the emitter and the collector respectively of the lateral PNP-transistor to be manufactured.

After the etching step another thin polysilicon layer 231 having a thickness of some hundreds of nm is deposited over the surface of the plate. This layer 231 is implanted with phosphorous or arsenic to become type N+ and forms, after heat treatment, a base connection of the lateral PNP-transistor to be manufactured. This thin polysilicon layer 231 is patterned and etched for forming the base connection, and thereupon the structure obtains the appearance shown by FIG. 16.

Figure 17:
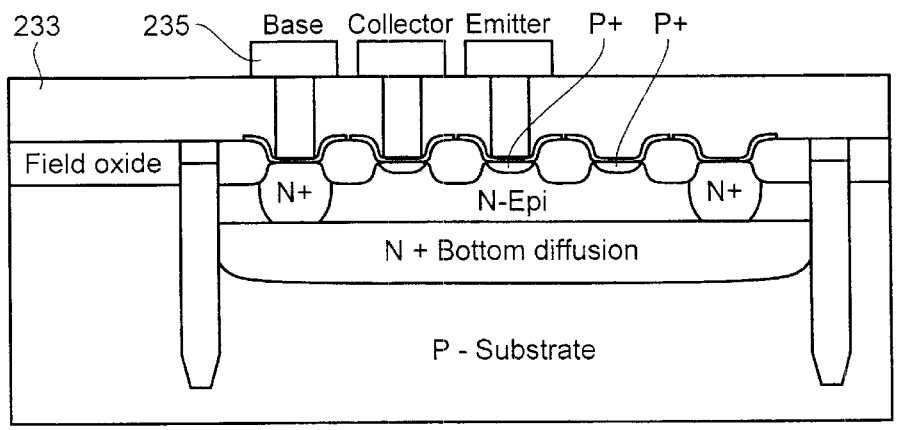
FIG. 17 is a schematic cross sectional view similar to FIG. 16 of the finished PNP-transistor having moderate performance, after passivating and metallization.
Figure 18:
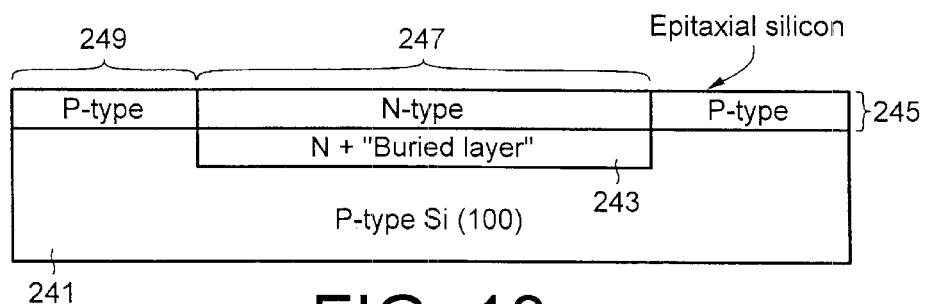
FIG. 18 is a schematic cross sectional view, which shows the structure, which is obtained after forming a bottom diffusion and an epitaxial surface layer when manufacturing a compact bipolar PNP-transistor isolated by trenches and having high performance.

The surface of the circuit is thereupon passivated, see FIG. 17, by a layer of, for example, silicon oxide 233, in which contact holes to the base, the emitter and the collector are lithographically defined. After etching these contact holes the circuit is metallized by sputtering for example aluminum. The electrically conducting layer 235 formed is then defined by lithography and etching for forming individual conductors on the surface of the plate, whereupon the result appears from FIG. 17.

In conjunction with FIGS. 18–20, 21b–25 an alternative embodiment of the manufacture of a trench isolated lateral PNP-transistor will now be described, which has the purpose of improving performance of a transistor thus manufactured. This alternative embodiment is also particularly suited for the case in which one wants to obtain a small area for each manufactured transistor, i.e., that the area, which is required on the surface of the substrate plate for each manufactured transistor is to be small, and in which the capacitances for base-to-substrate ($C_{bs}$), base-to-emitter ($C_{be}$), and base-to-collector ($C_{bc}$) are to be made as small as possible.

The manufacturing method agrees in some steps with the manufacturing method of a PNP-transistor as described above and these steps will not be described in detail. Thus, as above, the start material is formed by a plate 241 of monocrystalline silicon having its surface located in a (100)-crystal plane, see FIG. 18. The bottom diffusion or buried layer 243, which is formed by, a for example, a square region which is laterally confined and is made of a layer ion-implanted with arsenic, see also the view from above in FIG. 25, is lithographically defined, whereupon an epitaxial silicon layer 245 having a thickness of about 1 µm is grown on the plate. Thereupon N- and P-areas 247, 249 are defined at the surface of the plate by lithography combined with ion implantation. The N-area 247, which has been produced by ion implanting, e.g., phosphorous is placed directly on top of the bottom diffusion 243 of type N+, and within this area the PNP-transistor will be manufactured. The remaining areas 249, which, e.g., have been produced by ion implanting boron, are then P-doped and surround the N-doped area 247 and form a confinement of the component.

Figure 19:
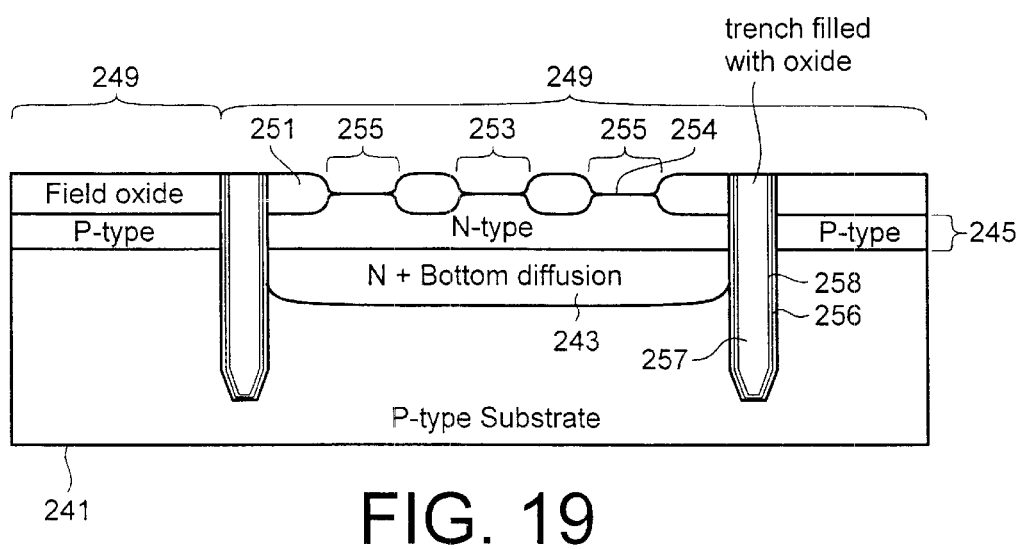
FIG. 19 is a schematic cross sectional to FIG. 18 after defining active areas and after isolating by means of trenches.
Figure 20:
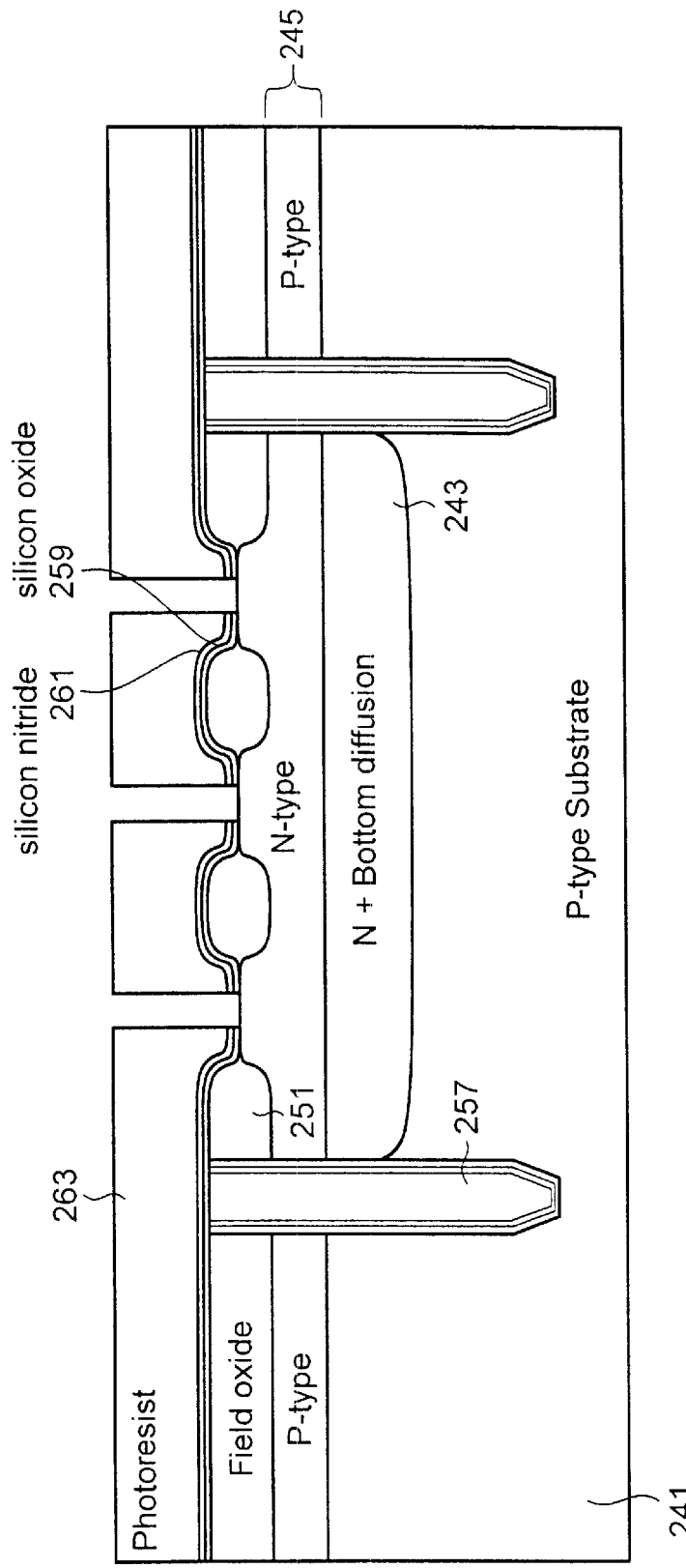
FIG. 20 is a schematic cross sectional view similar to FIG. 19 after patterning a laminate on active areas.

Active regions, see FIG. 19, are then defined by means of conventional LOCOS-methods and then regions of thick field oxide 251 are placed between the two regions 253, 255, which are located concentrically in relation to each other and within which, as seen from an inner point and outwards, the emitter and the collector respectively of the PNP-transistor are to be formed. The innermost region 253 can be a contiguous region having no holes, for example a convex region, such as a region having a square shape, whereas the outer region 253 is annular, for example having the shape of a square ring, see also FIG. 25. Thereupon isolation trenches 253 are lithographically defined, whereupon the substrate material is etched away by anisotropic dry etching, until the trenches 257 have obtained a desired depth, about 5–10 µm.

The surfaces and the walls in the trenches are thermally oxidized, e.g., they are provided with a thermally grown oxide layer 258, at the same time as a so called KOOI-oxide 254 having a thickness of a couple of tens of nm is grown on the regions 253 and 255 and a thin silicon nitride layer 257 having a thickness of about 60 nm is applied on top of the oxide, for example using LPCVD ("Low Pressure Chemical Vapour Deposition"). Thereupon, the trenches 257 are filled with an electrically well isolating material, such as, for example, with silicon oxide and in the latter case by depositing a silicon oxide layer over the surface of the plate by for example using SACVD ("SubAtmospheric Chemical Vapour Deposition"). This silicon oxide layer is etched away by dry etching, until a flat surface is obtained at the openings of the trenches. In conjunction with this planarizing etching also the nitride layer 256 located directly under the silicon oxide is removed, on flat or horizontal portions, which oxide in the etching procedure acts as an etch stopping layer. The silicon nitride layer 256 remains in the trenches 257 and there works as a diffusion barrier for possible impurities in the filling silicon oxide material. It can be observed in FIG. 19 that no area for a deep diffusion of type N+ for connection of the base is reserved or made, compare FIG. 16. Thereby the area at the surface of the plate, which is required by the PNP-transistor to be produced, becomes significantly smaller and then also the area laterally, which is used by the bottom diffusion 243, is also reduced. This results in that the base-to-substrate capacitance $C_{bs}$ is reduced.

After defining the active regions 253, 255, etching and filling the trenches 257 and in addition removal of the KOOI-oxide layer 257, a thin layer 259 of silicon oxide having a thickness of about 30 nm is deposited over the plate preferably by means of thermal oxidation, another KOOI-oxide layer, see the above-cited article by J. A. Appel et al. Alternatively, the formerly applied KOOI-layer 254 can remain. Thereupon, the plate is coated with a thin silicon nitride layer 261 having a thickness of about 30 nm, e.g., by means of LPCVD-methods. This laminate, which is now applied and includes of at the bottom silicon oxide and on the top silicon nitride, is then lithographically patterned by applying a photoresist layer 263, patterning it and thereupon etching through the openings made in the photoresist layer.

Figure 21A:
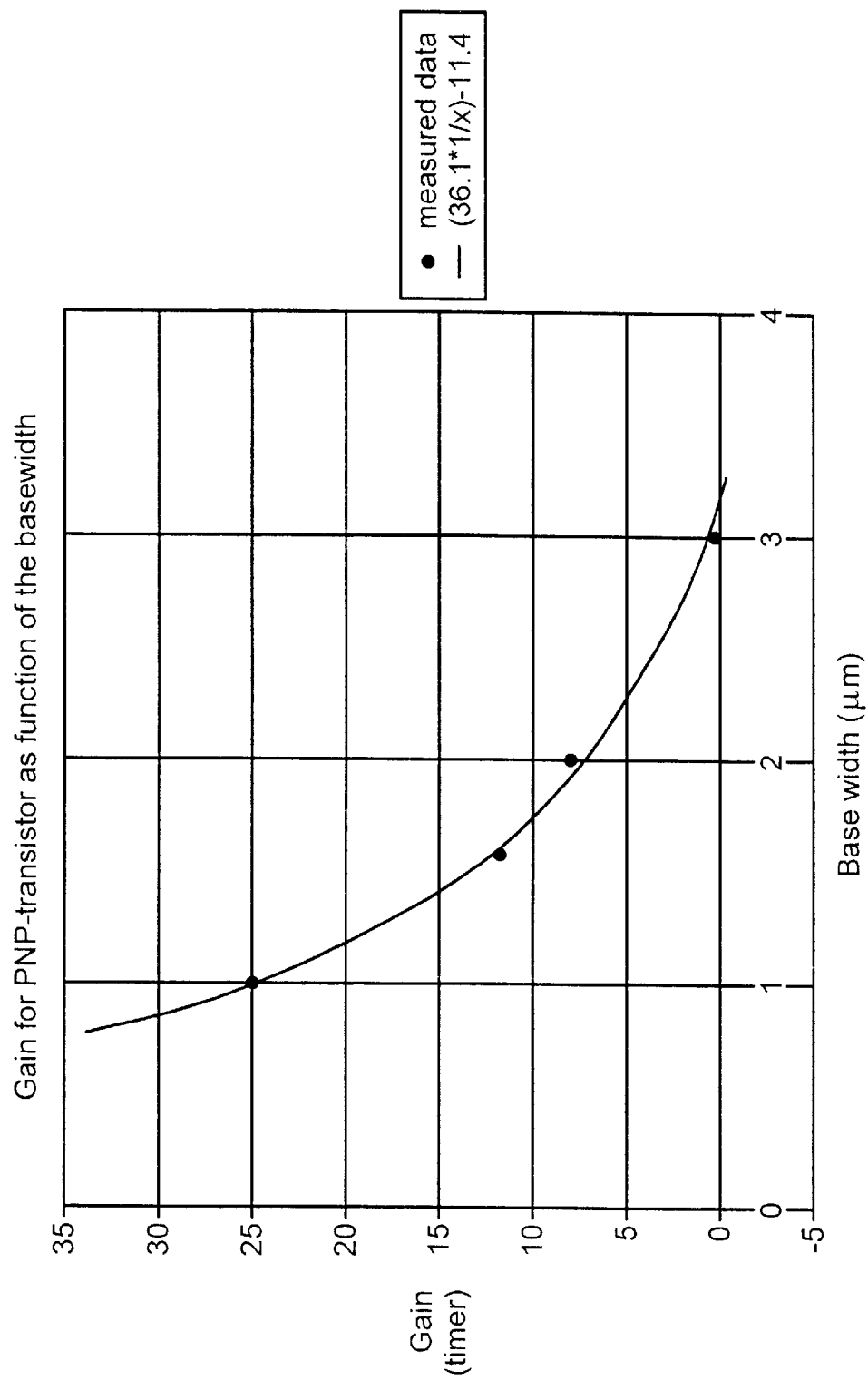
FIG. 21a is a diagram of current gain as a function of the base width of a typical PNP transistor.

The advantage of this procedure is, that the distance between the emitter and collector regions, which determines the base width of the PNP-transistor to be manufactured, becomes well defined. Thereby a better control of the limit frequency $F_t$, the breakthrough voltage $B_{vceo}$ and the current gain $H_{fe}$ of the transistor are obtained. In FIG. 21a a diagram of the current gain as a function of the base width for a typical transistor is illustrated.

Normally one lets the separation between the emitter and collector regions be defined by the field oxide strings 251. However, such an extension given by field oxide strings is not well defined owing to the formation of so called "birdsbeak" when creating field oxide using the LOCOS-methods, see the above-cited Swedish patent application 9702693-4.

This patterning step also results in that the emitter and collector openings can be made smaller, since they are now lithographically defined. Thereby, both the capacitances of emitter-to-base $C_{be}$ and collector-to-base $C_{bc}$ are reduced.

Figure 21B:
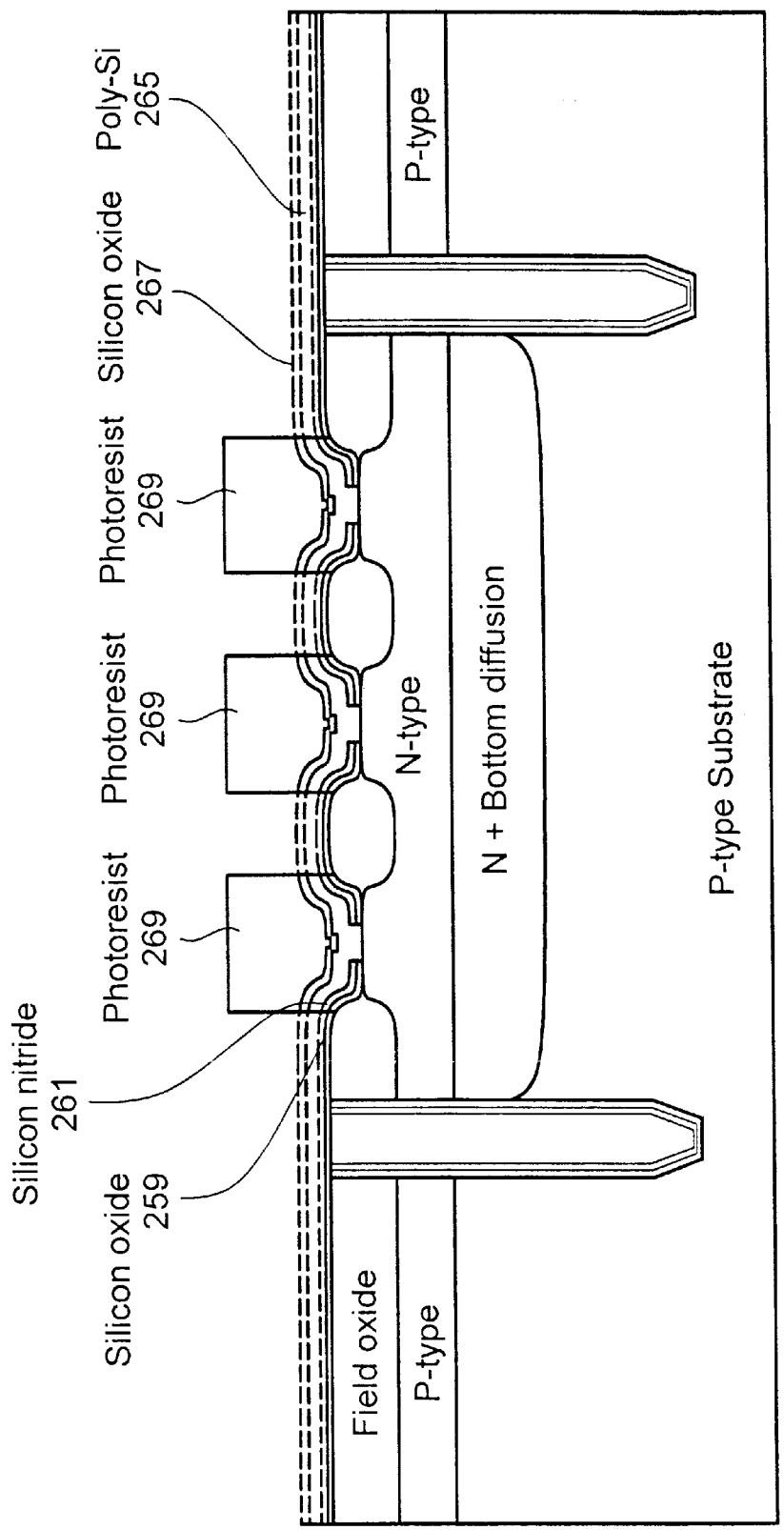
FIG. 21b is a schematic cross sectional view similar to FIG. 20 after patterning polysilicon on active areas.
Figure 22:
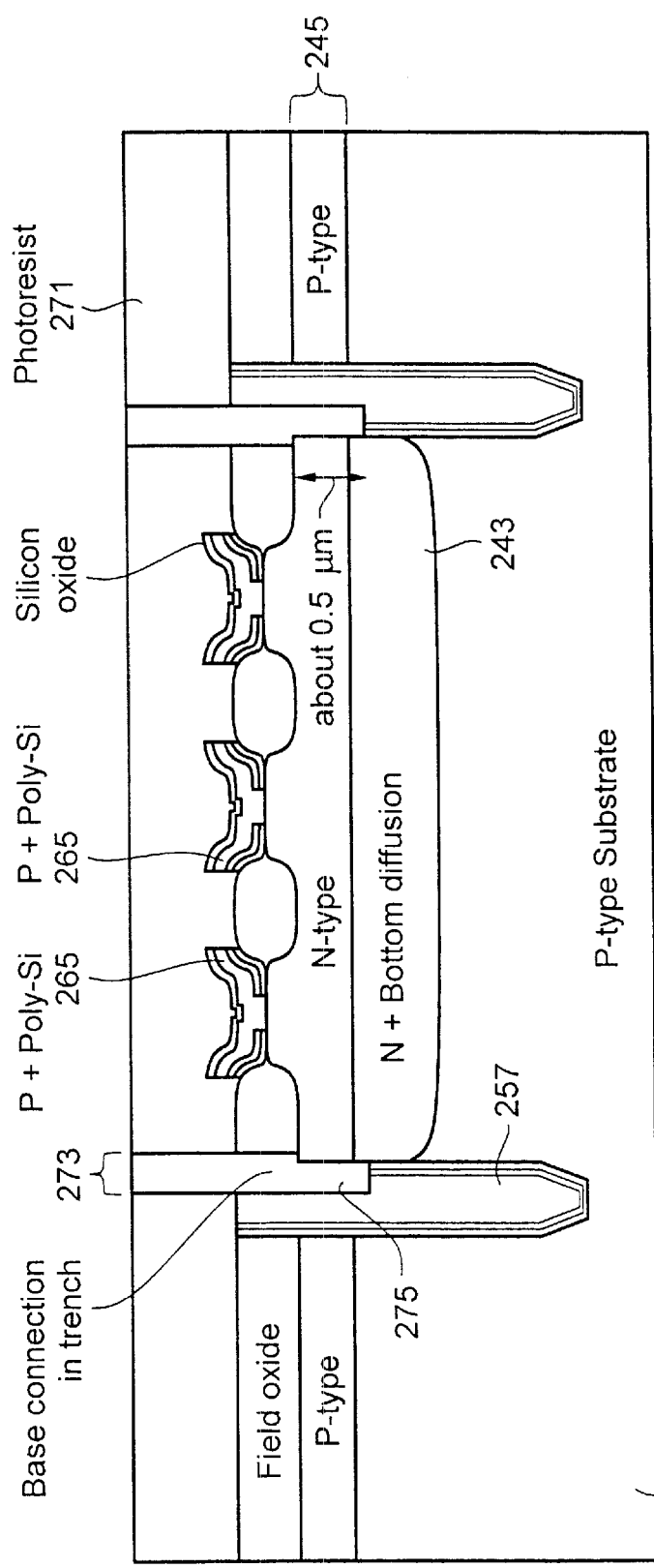
FIG. 22 is a schematic cross sectional view similar to FIG. 21b after patterning and etching a base connection.

After the etching step, the photoresist layer 263 is removed in some known manner, whereupon a thin layer 265 of polysilicon, of microcrystalline silicon or of amorphous silicon having a thickness of about 200 nm is deposited over the surface of the plate, see FIG. 21b. This layer, which in the following will be called the polysilicon layer, is thereupon doped to become type P+ by ion implanting boron, e.g., by using B or $BF_2$. This layer can also obtain its doping directly when making the deposition and then the ion implanting step is omitted. Thereupon a thin oxide layer 267 is deposited by CVD having a thickness of about 200 nm on top of the polysilicon layer 65. The CVD-oxide layer 267 and the polysilicon layer 265 are then lithographically patterned by applying a photoresist layer 269, patterning it, so that the remaining portions of the photoresist layer 269 correspond to the emitter and collector regions 253, 255 and then dry etching such as plasma etching, the CVD-oxide layer 267 and the polysilicon layer 265 being then removed from the portions within which they are not protected by the photoresist layer 269.

After the patterning including etching of the sequence of layers from above of oxide/polysilicon the remaining portions of the photoresist layer 269 are removed in a known way. The surface of the plate is thereupon patterned again, see FIG. 22, using a photoresist layer 271 for defining connections to the bottom diffusion layer 253 of type N+, which forms an interior connection region to the base of the lateral PNP-transistor to be manufactured.

These base connections are placed, so that they are completely or partly located in the isolation trench 257, which surrounds the component. Thereby, the area of the component is reduced, and at the same time the base-to-substrate capacitance $C_{bs}$ is reduced.

Openings 273 are thus made in the photoresist layer 271 placed over the interior sidewalls of the isolating trench 257, i.e., the sidewalls, which form the borders to the region, within which all the active regions are located, and which in particular form borders to the bottom diffusion 243 of type N+ and to the epitaxial N-doped layer 245, which forms a base region of the PNP-transistor to be manufactured. The openings 273 should in any case be placed, so that they pass somewhat beyond the interior sidewall in the trench 257, i.e., so that they have inner portions located on the inner side of the interior sidewall in the trench 257. Thereupon, oxide in the trench 257 is removed by means of a dry etching procedure down to a depth of about 0.5 μm below the lower surface of the field oxide 251 in the embodiment as described herein. The depth of the etching is in any case adapted, so that the etched holes 275 reach down to the bottom diffusion 243 of type N+. The etching can be made, so that it only removes oxide and also nitride and does not noticeably attack the material in the adjacent regions of the bottom diffusion 243 and the epitaxial N-doped layer 245. Owing to the fact that the openings 273 are located over the interior sidewalls of the trench 257 and somewhat over the outer side of these sidewalls, i.e., over regions located at that edge of the trench 257, which is located closest to the centre of the active regions, it is ensured that all oxide in the trench 257 at its inner wall is removed, also the nitride layer 256 and the thermally grown oxide layer 254. The resulting holes will thereby, as appears from FIG. 22, have one of their sides or sidewalls in a direct contact with the region, which remains of the N-doped epitaxial region 245, in which the active junctions are formed, and the bottom diffusion 243. The holes 275 thus have one of their sidewalls, the inner sidewall, located substantially at a place where earlier a portion of the inner sidewall of the trench 257 was located.

In an exemplary way the holes 275 are made as a recess or deep groove, which has a closed shape or annular shape and passes around and laterally confines all of the surface, within which the active regions are located, and in particular the inner walls of the holes 275 form 20 the exterior lateral border of the lower active region, the base region or the N-region. The holes 275 are also made, so that a sufficient amount of isolating material remains in the trench 257, so that it is capable of fulfilling its electrically isolating function. The width of the trench 257 should, for space reasons and in order that it will be possible to make the refilling by the use of an oxide layer having a reasonable thickness, be made as small as possible and can, for example, be 0.8–1 μm, which allows that the etching of the trench can be made, so that the shape of the trench is obtained, which appears from the figures. The openings 273 of the photoresist layer 271 can have a width of 0.5–0.6 μm and the resulting contacting groove, which is formed by the holes 275, can then have a width of about 0.4–0.5 μm.

Figure 23:
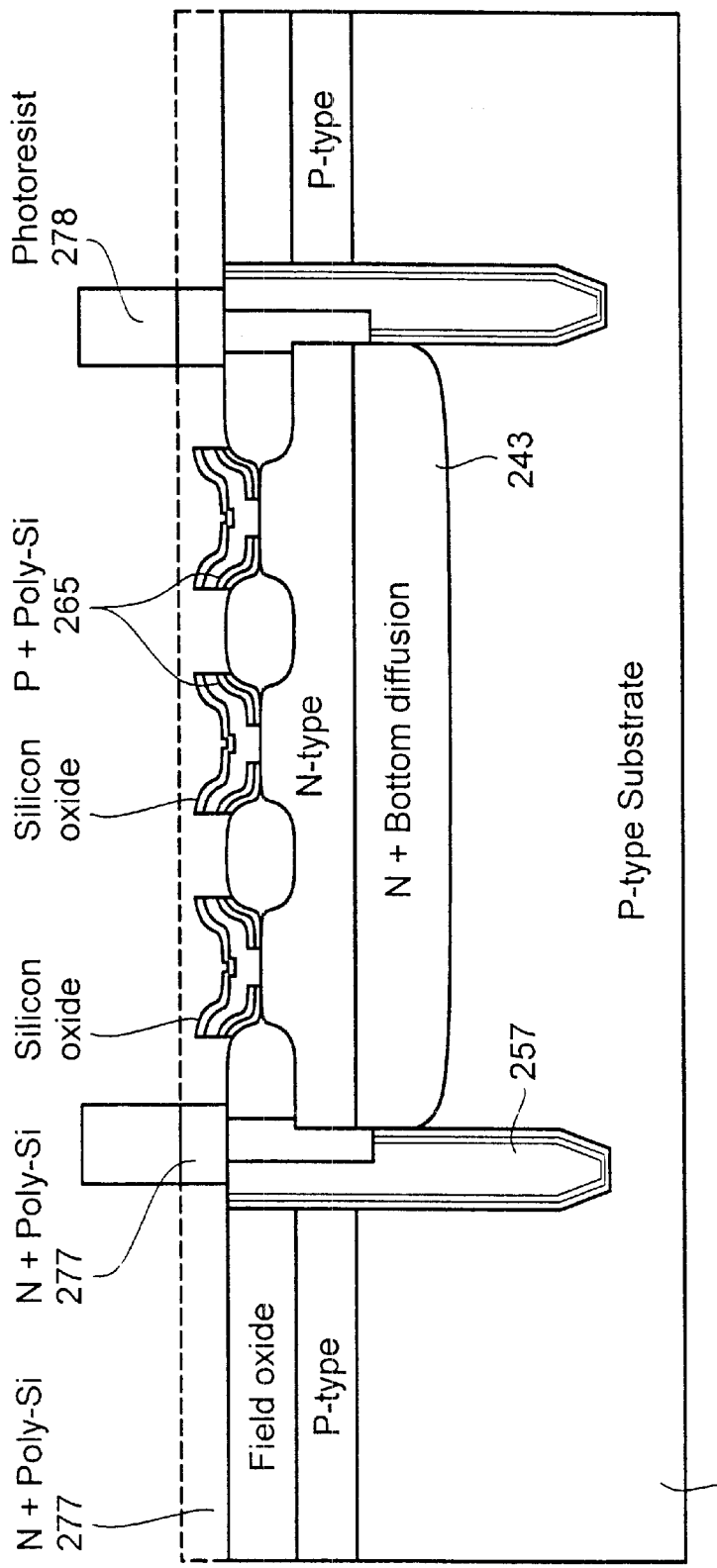
FIG. 23 is a schematic cross sectional view similar to FIG. 22 after depositing, patterning and etching polysilicon layers for an upper base connection.
Figure 24:
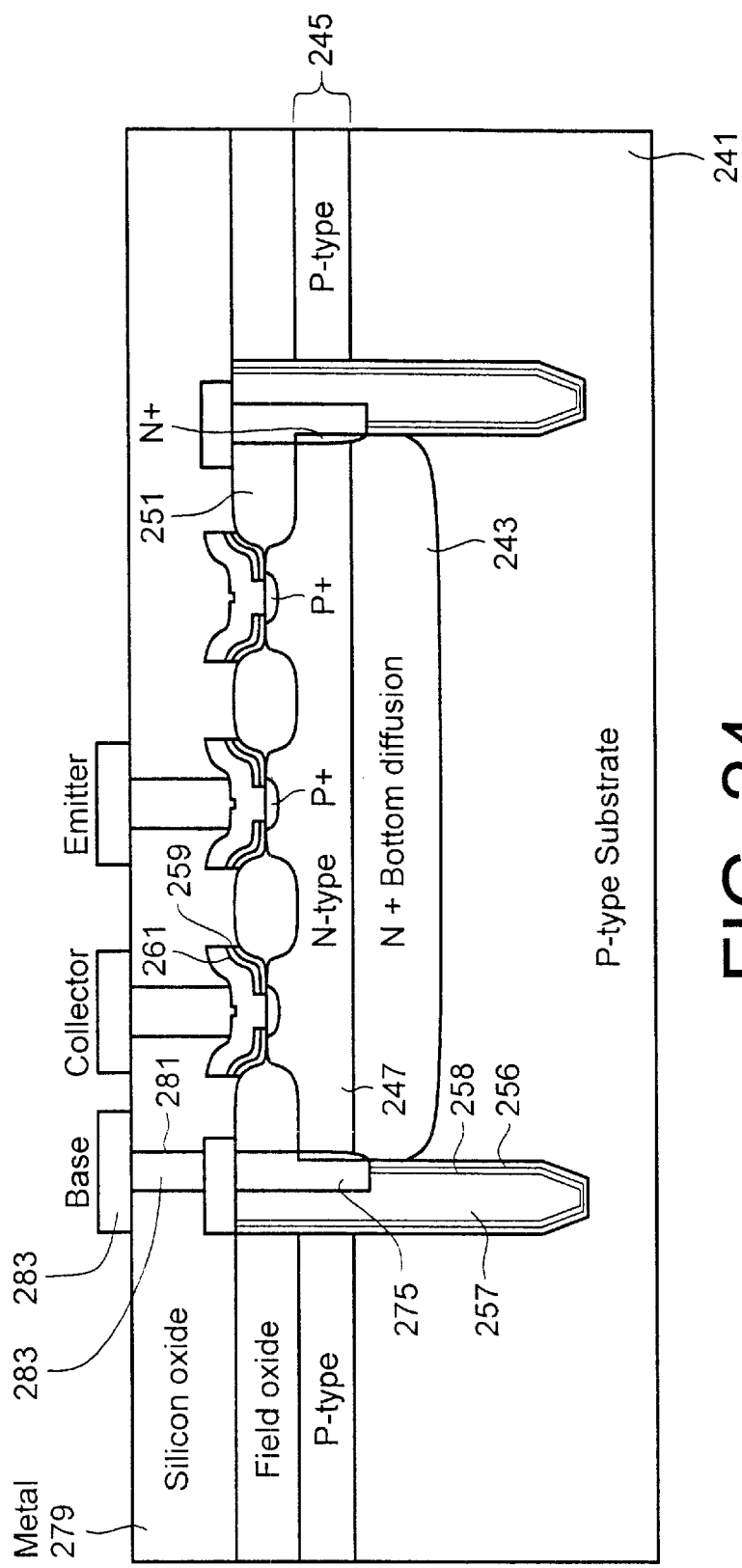
FIG. 24 is a schematic cross sectional view similar to FIG. 23 after passivating and metallization, the construction of the finished PNP-transistor appearing from this cross sectional view.

After finishing etching and removing the photoresist layer 271, a thin layer 277 of polysilicon having a thickness of about 0.3 μm is deposited over the plate, see FIG. 23. The polysilicon layer 277 is conformally applied over the surface of the plate, and then the etched holes 275 for the base connection are completely-or partly filled, depending on the choice of width of the holes and the layer thickness of the polysilicon layer 277. The polysilicon layer 277 is thereupon strongly doped to become type N+ by ion implanting, e.g., phosphorous and/or arsenic. Thereupon, it is lithographically patterned by applying a photoresist layer 278, patterning it and etching unprotected portions at the surface of the plate, so that the polysilicon layer 277 will only remain on top of or in a direct connection with the etched holes 275 for the base connection. Then thus, the other regions at the surface of the plate are made to be exposed, which are covered with the polysilicon layer 277 of type P+.

The photoresist layer is then removed in a known manner, whereupon the plate is heat treated at a high temperature in order to make dopants diffuse out of the polysilicon layers 265, 277 of type P+ and N+ respectively. Then, emitter-base and collector-base junctions are formed somewhat below the surface of the epitaxial layer 245 within the emitter and collector regions 253, 255, respectively, and at the same time a complete base connection is produced. The circuit is thereupon passivated, see FIG. 24, by applying a layer 279 of for example silicon oxide, in which contact holes 281 to the base, the emitter and the collector are lithographically defined. After etching contact holes down to the respective conducting polysilicon layer the circuit is metallized by sputtering for example aluminium. The contact holes can be given a complete filling by means of so called "Force Fill"-methods, by using a high applied hydrostatic pressure after finishing the sputtering. The conductor layer 283 is then lithographically defined. The final result appears from FIG. 24.

In FIG. 25 a view is shown of the manufactured component as seen from above. All of the layers are not drawn for the sake of clarity. It should be observed that the exterior corners of the isolating trench 257, which surrounds the PNP-transistor as a frame, has been made oblique by an angle of about 45° in order to improve the refilling of the trench. It appears advantageous to always form a deep groove, which is to be filled with some material, such as isolating or conducting material, to have walls, which do not form corners having angles about 90°, but these angles should instead be as large as possible, for example 135°. Also the hole 275, which forms a closed groove, which in its major part is located in the trench 257, has its outer sidewall bevelled to an angle of about 45°. Also, the outer sidewalls of the trench 123 shown in FIG. 13c have no right angles, but the flat sidewall segments form an angle of 135° to each other.

Modifications of the manufacturing method as described above are apparent to one skilled in the art. When considering FIG. 24 it is, for example, realized that there are possibilities of producing the holes 275 in the trench 257 for the base connection and/or filling these holes at the same time as making the holes 281 for the metal contacts or at the same time as these holes 281 are filled with a metal such as tungsten. When using tungsten as a contact hole metal it is applied using CVD, and then before applying it, in the same way as for applying aluminium as described above, suitably Ti and thereupon TiN are applied by sputtering in order to improve the electrical contact between the applied metal material, such as the tungsten plugs, and electrical connection layers on the silicon plate.

If the collector and emitter regions are combined into one single region, by among other steps omitting the inner annular field oxide string and by using a suitable configuration of masks for producing the separate collector and emitter layers, a diode structure is obtained, which can be given good characteristics and is suited to be used as a varactor diode. Also, this diode structure is within the scope of the appended claims, as well as other semi-conducting structures having a similar construction resembling the PNP-transistor as described above. Such structures should in principle comprise an interior layer having a high conductivity, which forms an electrical connection to an active region or layer and which can extend under substantially all of the active region and in addition an electrically isolating trench, which surrounds one or more active regions located at the surface of the device.

It is also realized, that in the case where the isolating trench 257 can be made to have a sufficiently small width, all of the annular contact grooves 275 can be placed substantially inside the trench. However, when etching the contact groove 275, then an etching process has to be used, which does not only remove oxide but also silicon.

The manufacturing method described above can be modified in many ways which are self-evident to one skilled in the art in the field of the semi-conductor processing technology. Different steps can, for example, change their order or even be deleted.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. A bipolar device formed at a surface of a semi-conducting plate, the bipolar device comprising:
   active layers forming an active region located at the surface;
   an interior layer having high conductivity and forming an electrical connection to one of the active layers and extending under substantially all of the active region;
   an electrically isolating trench surrounding the active region;
   a recess located at least partly in or in contact with the electrically isolating trench and filled with an electrically-conducting material in electrical contact with the interior layer at a location directly under the recess;
   wherein the recess comprises a groove having a frame-like, annular or closed configuration, the groove extending around the one active region and with one first sidewall confining and forming a direct border to the active region, the contact resistance of the electrically conducting material in the recess to the region of interior layer located directly under the recess thereby being low.

2. The bipolar device of claim 1, wherein the first sidewall of the groove is located substantially aligned with a deeply located sidewall in the trench.

3. The bipolar device of claim 1, wherein the electrically conducting material in the recess forms at least a part of a base connection of a trench isolated lateral PNP-transistor or at least a portion of a connection of a buried N-region of a semi-conductor diode.

4. The bipolar device of claim 1, wherein the electrically conducting material in the recess comprises at least one of doped amorphous silicon, doped microcrystalline silicon, and doped polysilicon.

5. The bipolar device of claim 1, wherein the electrically conducting material in the recess comprises metal.

6. The bipolar device of claim 5, wherein the metal comprises one of tungsten and aluminum.

7. The bipolar device of claim 1, wherein the sidewalls of the trench and/or the groove as seen from above are parallel to each other, have a uniform distance from each other around all of the at least one active region and have the shapes of two concentric rectangles or squares located inside each other, the corners in the outer sidewall being bevelled by 45° in order to facilitate, when manufacturing the device, producing the trench by filling with an electrically isolating material or filling the recess with the electrically conducting material respectively.

8. The bipolar device of claim 1, wherein the corners in the outer sidewall of the trench and/or the groove have angles exceeding 90° in order to facilitate, when manufacturing the device, producing the trench by filling with an electrically isolating material or filling the recess groove with the electrically conducting material, respectively.

9. The bipolar device of claim 8, wherein the angles are about 135°.

10. The bipolar device of claim 8, wherein the angles are at least 135°.

11. The bipolar device of claim 1, wherein the at least one active region comprises emitter and collector regions, at least one of the emitter region and the collector region being determined by an opening in an electrically isolating surface layer.

12. The bipolar device of claim 9, wherein the areas of the emitter and the collector regions are surrounded, as seen along the surface of the device, by thick field oxide regions, the electrically isolating surface layer extending over and beyond surrounding field oxide regions, so that a strip of the electrically isolating surface layer is located between the emitter or collector region and those of the field oxide regions that are located closest to the respective emitter or collector region.

13. The bipolar device of claim 12, wherein the electrically isolating surface layer comprises a laminate of silicon nitride and silicon oxide.

14. A bipolar device formed at a surface of a semi-conducting plate and comprising an electrically isolating trench, which at least partly surrounds an active region located at the surface of the device and which is filled with an electrically isolating material and has outer and inner sidewalls as seen from above, and comprising a groove, which at least partly surrounds an active region located at the surface of the device and which is filled with an electrically conducting material and has outer and inner sidewalls as seen from above, wherein the corners in the outer sidewall of the trench and of the groove have angles significantly exceeding 90° in order to facilitate, when manufacturing the device, refilling the trench with the electrically isolating material or the groove with the electrically conducting material respectively.

15. The bipolar device of claim 14, wherein the sidewalls of the trench and the groove as seen from above are parallel to each other having a uniform distance around all of the active region and has the shape of two concentric rectangles or squares, which are located inside each other, the corners in the outer sidewall being bevelled by 45°.

16. The bipolar device of claim 14, wherein the angles are about 135°.

17. The bipolar device of claim 14, wherein the angles are at least 135°.

18. A bipolar device at the surface of a semi-conducting plate comprising:

active layers forming at least one active region;

an electrically conducting strip defining a first opening in the at least one active region, the electrically conducting strip thereby located at the edge of the first opening, the electrically conducting strip being electrically connected to one of the active layers at a location directly under the electrical conducting strip; and an electrical isolation located at an inner edge of the electrically conducting strip and confining a second opening, in which an electrical connection can be made, wherein the electrically conducting strip has a frame-like, annular or closed configuration extending all around the first opening, the contact resistance of the electrically conducting strip to the region of the active layer located directly under the electrical conducting strip thereby being low.

19. The bipolar device of claim 18, wherein the first opening is an emitter opening in an NPN-transistor, the electrically conducting strip forming a connection to a base layer of the NPN-transistor.

* * * * *